United States Patent [19]
Dickey et al.

[11] Patent Number: 6,032,028
[45] Date of Patent: Feb. 29, 2000

[54] RADIO TRANSMITTER APPARATUS AND METHOD

[75] Inventors: Daniel L. Dickey, Rowlett, Tex.; David L. Hershberger, Nevada City, Calif.

[73] Assignee: Continentral Electronics Corporation, Dallas, Tex.

[21] Appl. No.: 08/794,744

[22] Filed: Feb. 3, 1997

Related U.S. Application Data

[60] Provisional application No. 60/015,293, Apr. 12, 1996.

[51] Int. Cl.$^7$ ...................................................... H04B 1/04
[52] U.S. Cl. .......................... 455/110; 455/103; 332/117; 332/144
[58] Field of Search ............................ 455/110–113, 103, 455/118, 93, 104, 105, 109, 47, 114; 332/100–105, 119, 151, 159, 117, 149, 144, 170; 375/296, 302, 308, 303, 301

[56] References Cited

U.S. PATENT DOCUMENTS

| | | |
|---|---|---|
| 1,941,068 | 12/1933 | Armstrong . |
| 3,654,450 | 4/1972 | Webb . |
| 3,689,914 | 9/1972 | Butler . |
| 3,806,806 | 4/1974 | Brolin . |
| 3,824,498 | 7/1974 | McBride . |
| 3,825,834 | 7/1974 | Stuart et al. . |
| 3,913,021 | 10/1975 | McCarthy et al. . |
| 3,958,191 | 5/1976 | Jones, Jr. . |
| 4,003,001 | 1/1977 | Jones, Jr. . |
| 4,134,072 | 1/1979 | Bolger . |
| 4,159,527 | 6/1979 | Yahata et al. . |
| 4,185,247 | 1/1980 | Harrison, Jr. . |
| 4,229,821 | 10/1980 | de Jager et al. . |
| 4,263,565 | 4/1981 | Astle . |
| 4,304,965 | 12/1981 | Blanton et al. . |
| 4,315,219 | 2/1982 | Rocheleau et al. . |
| 4,328,554 | 5/1982 | Mantione . |
| 4,331,941 | 5/1982 | Kovalick et al. . |
| 4,345,500 | 8/1982 | Alonso et al. . |
| 4,346,477 | 8/1982 | Gordy . |
| 4,413,236 | 11/1983 | Sochor . |
| 4,414,632 | 11/1983 | Murrell . |
| 4,482,974 | 11/1984 | Kovalick . |
| 4,482,975 | 11/1984 | King et al. . |
| 4,494,073 | 1/1985 | Sorgi . |
| 4,516,084 | 5/1985 | Crowley . |
| 4,603,304 | 7/1986 | Burns et al. . |
| 4,609,881 | 9/1986 | Wells . |
| 4,646,032 | 2/1987 | Wheatley, III et al. . |
| 4,652,832 | 3/1987 | Jasper . |
| 4,659,999 | 4/1987 | Motoyama et al. . |
| 4,682,122 | 7/1987 | Remy et al. . |
| 4,700,390 | 10/1987 | Machida . |
| 4,707,665 | 11/1987 | Nugent et al. . |
| 4,794,556 | 12/1988 | Rader . |
| 4,841,256 | 6/1989 | Gastgeb . |
| 4,940,984 | 7/1990 | Kleiber . |
| 4,947,455 | 8/1990 | Swanson . |
| 4,984,188 | 1/1991 | Kato . |

(List continued on next page.)

*Primary Examiner*—Nguyen Vo
*Attorney, Agent, or Firm*—Lowe Hauptman Gopstein Gilman & Berner

[57] ABSTRACT

An FM transmitter includes I and Q channels, each deriving a baseband sinusoidal wave having a frequency determined by speech and/or music broadcast information amplitude and nominally having the same maximum amplitude. Each wave drives a different balanced mixer, each responsive to orthogonally phased carrier waves. Outputs of the mixers are added to derive a frequency modulated output wave. The channels, mixers, and circuitry associated with them tend to introduce unwanted components in the output wave. Offset, peak amplitude, phase and relative delay of the added mixed outputs are such that the unwanted components are substantially eliminated from the output wave. The sinusoidal waves are derived by DACs responsive to signals derived by a digital processor having a memory storing amplitude vs. phase position values and slope vs. phase position values that are combined in response to samples of the broadcast information. The stored amplitudes and slopes control sinusoidal wave offset, peak amplitude and phase. The waves and delay times of the channels driving a power amplifier of the transmitter are calibrated on line according to certain embodiments.

116 Claims, 10 Drawing Sheets

U.S. PATENT DOCUMENTS

| | | |
|---|---|---|
| 4,990,867 | 2/1991 | Ogura et al. . |
| 5,028,887 | 7/1991 | Gilmore . |
| 5,093,632 | 3/1992 | Hietala et al. . |
| 5,122,763 | 6/1992 | Saeki et al. . |
| 5,146,186 | 9/1992 | Vella . |
| 5,162,763 | 11/1992 | Morris ................................. 455/109 |
| 5,202,642 | 4/1993 | Dixon . |
| 5,220,557 | 6/1993 | Kelley . |
| 5,231,314 | 7/1993 | Andrews . |
| 5,254,955 | 10/1993 | Saeki et al. . |
| 5,291,428 | 3/1994 | Twitchell et al. . |
| 5,293,407 | 3/1994 | Shibata ................................. 332/103 |
| 5,303,412 | 4/1994 | Kushner . |
| 5,309,474 | 5/1994 | Gilhousen et al. . |
| 5,351,016 | 9/1994 | Dent ................................. 332/159 |
| 5,353,311 | 10/1994 | Hirata et al. . |
| 5,394,106 | 2/1995 | Black et al. . |
| 5,404,405 | 4/1995 | Collier et al. . |
| 5,414,390 | 5/1995 | Kovacs et al. . |
| 5,422,909 | 6/1995 | Love et al. . |
| 5,430,659 | 7/1995 | Miller . |
| 5,437,281 | 8/1995 | Lin et al. . |
| 5,467,041 | 11/1995 | Baba et al. . |
| 5,574,994 | 11/1996 | Huang et al. ................................. 375/296 |
| 5,784,412 | 7/1998 | Ichihara ................................. 375/302 |

RADIO TRANSMITTER APPARATUS AND METHOD

CROSS REFERENCE RELATED TO APPLICATION

This application claims the priority date of Provisional U.S. application Ser. No. 60/015,293, filed Apr. 12, 1996, the disclosure of which is incorporated in its entirety by reference herein.

FIELD OF INVENTION

The present invention relates generally to radio transmitters and more particularly to a radio transmitter apparatus and method including an angle modulator with a digital synthesizer responsive to speech and/or music broadcast information. Another aspect of the invention relates to a radio transmitter apparatus and method wherein different phases of a carrier are respectively combined with different sinusoidal like waves having (1) an angle determined by speech and/or music broadcast information and (2) at least one of (a) controlled DC offset, (b) controlled phase displacements and (c) controlled amplitudes, wherein these controlled parameters compensate for differential variations of circuitry which combines the carrier and sinusoidal like waves. The waves are "sinusoidal like," not true sinusoids, because they are instantaneous angle (i.e. phase/frequency) modulated, i.e. have different periods as a function of broadcast information that is subject to instantaneous changes. For simplification these sinusoidal like waves are referred to in the remainder of the specification as sinusoidal waves or sinusoids. A further aspect of the invention relates to a so-called single sideband I-Q modulator that drives a load while at least one of a processing channel or the amplitude or phase of a sinusoidal like wave is being adjusted.

BACKGROUND ART

Direct digital synthesizers (DDS) are attractive devices to digitally produce angle modulated radio broadcast signals, e.g. a carrier frequency that is modulated to produce signals combining frequency modulation (FM), coded orthogonal frequency division multiplex (COFDM), quadrature amplitude modulation (QAM), single sideband and independent sideband (SSB/ISB), frequency shift key (FSK), and phase shift key (PSK). The present invention is described for FM but many of the principles are applicable to these other types of signals.

Technology limitations of digital-to-analog (D/A) converters do not permit the generation of an FM broadcast signal containing speech and/or music broadcast information on channel (88.1 to 107.9 MHz in the United States) with the necessary degree of spurious rejection (80 dB or better). Consequently, the FM broadcast signal has in the past been generated at some lower frequency and translated to the FM broadcast band, using analog techniques.

So-called I/Q circuitry is frequently used to produce a single sideband modulated signal. The I/Q circuitry includes first and second channels each including a mixer. The mixers of the first and second channels are driven by orthogonal phases of a carrier and by orthogonal phases of a sinusoidal wave including the modulation information. Output signals of the mixers are added to eliminate one sideband and the carrier.

One way to produce a DDS FM broadcast signal is to generate the DDS FM signal at a lower frequency such as several MHz, and then heterodyne the signal up to the operating frequency. This may require a single frequency conversion or multiple frequency conversions.

Depending on the choice of an intermediate frequency (IF), a single conversion would require very good analog band pass filters. In the case of a frequency-agile system, the analog band pass filters probably require retuning if the carrier frequency is changed. Filter requirements could be relaxed through the use of a single sideband or so-called "imageless" mixer system.

A double conversion system would translate the first IF frequency to a relatively high second IF, such as 70 or 140 MHz, possibly using a SAW filter. This permits the structure for performing second conversion, to the operating frequency, to use only fixed filters.

The problems associated with these conventional digital synthesizer and frequency conversion systems are (1) digital-to-analog converter (DAC) spurious outputs, and (2) filter distortions. The DAC tradeoff is speed versus spurious output. In general, as the DAC runs faster, its spurious output increases. Conversely, as the first IF is lowered, the spurious performance improves.

There is a further tradeoff between DAC speed and complexity of the up-conversion system. The lower the IF frequency, the more complex the up-conversion system must be. Conversely, as IF frequency is raised, the design of the up-conversion system becomes easier.

The filters involved in the process can contribute frequency response and group delay anomalies. In addition, SAW filters have a "triple transit" echo distortion. Although these are linear distortions, the effects of the echo distortions on nonlinear modulation systems, such as FM, produce nonlinear distortions in the demodulated modulation functions. These distortions include nonlinear (harmonic and intermodulation) distortion, reduced stereo separation, subcarrier crosstalk, etc.

It is, accordingly, an object of the present invention to provide a new and improved angle modulated transmitter for speech and/or music broadcast information wherein the same apparatus can be used, without adjustment, for all carrier frequencies throughout standard operating bands.

Another object of the invention is to provide a new and improved angle modulated radio transmitter responsive to speech and/or music broadcast information wherein sinusoidal waves, at baseband, having an angle modulation index proportional to the speech and/or music broadcast information amplitude are directly applied, without intermediate heterodyning, to mixers responsive to the transmitter carrier frequency to produce a transmitted output wave having virtually no components other than the component at the carrier frequency, as deviated by the angle modulation of the sinusoidal waves.

An additional object of the invention is to provide a new and improved angle modulated radio transmitter responsive to speech and/or music broadcast information including a direct digital synthesizer for deriving digital signals representing sinusoidal waves at baseband.

An additional object of the invention is to provide a new and improved angle modulated radio transmitter responsive to speech and/or music broadcast information wherein the transmitter includes a direct digital synthesizer for deriving digital signals representing sinusoidal waves, wherein the sinusoidal waves have amplitudes and phase angles to compensate for imperfections in analog combining circuitry for the sinusoidal waves and the carrier frequency.

Another object of the invention is to provide a new and improved angle modulated radio transmitter responsive to speech and/or music broadcast information, wherein the transmitter has simple filtering circuitry and does not require heterodyning to an intermediate frequency.

Yet another object of the invention is to provide a new and improved angle modulated radio transmitter responsive to speech and/or music broadcast information, wherein the transmitter has a direct digital synthesizer with a relatively low capacity memory for storing signals enabling variable frequency sinusoidal waves to be derived.

A further object of the invention is to provide a new and improved angle modulated radio transmitter responsive to speech and/or music broadcast information, wherein the transmitter has a direct digital synthesizer for deriving a phase representing signal for addressing a memory which stores N bit words representing sinusoidal wave information, wherein the synthesizer responds to the N bit words to derive (N+P) bit words representing the amplitudes of different phases of the sinusoidal wave.

Yet another object is to provide a new and improved single sideband I/Q modulator that is adjusted to compensate for unwanted components while it is driving a load in response to broadcast information.

THE INVENTION

In accordance with one aspect of the invention, on-channel angle modulated broadcast signals representing speech and/or music broadcast information provide direct digital synthesis (DDS) by performing a direct conversion at baseband. In this case, the first IF frequency is zero. The DDS produces orthogonal in-phase ("I") and quadrature ("Q") baseband components of the angle modulated broadcast signal which are applied to a pair of mixers driven in quadrature from a carrier source at the desired operating frequency. This system has the following advantages:

1. The DACs operate at a much lower frequency word rate, e.g., 2.432 MHz, than conventional systems. This results in improved spurious rejection.
2. Because the DACs run more slowly, the DACs are much more accurate than those used in conventional systems. Sixteen-bit DACs can be used for direct conversion; 12-bit DACs are typically used in conventional systems.
3. The clock rate of the DDS is much lower in direct conversion systems. This makes it feasible to perform the DDS function in software run on a conventional digital processor rather than in dedicated DDS hardware.
4. If good quality mixers and I/Q reconstruction low pass filters are used, it is not necessary to filter out-of-band spurious mixer outputs (other than harmonics). This makes it easier to obtain frequency agility within the 88.1–107.9 MHz carrier frequency range used in the United States.

As every technology is a tradeoff against others, the problems associated with direct conversion are:

1. Mismatches in I and Q reconstruction low pass filters, RF mixers, and quadrature drive to the mixers that create an in-band spurious image.
2. Offsets in the RF mixers create a carrier feedthrough component.

The present invention solves these two problems associated with a direct conversion system, to make the technology practical.

Conventional doubly-balanced RF mixers can be relied on to provide about 40 dB of carrier rejection under normal conditions of temperature variations, component aging, etc. Similarly, single sideband mixers normally produce about 40 dB of sideband discrimination. If such a mixer circuit having only 40 dB of carrier rejection and 40 dB rejection of the in-band image were used in a direct conversion FM system, FM broadcast performance would be marginal; a 1 kHz stereo signal would measure about 0.15% total harmonic distortion (THD) and a 15 kHz signal would measure about 0.7% THD.

The specific contributors to spurious output are:

1. Mixer offsets which create carrier feedthrough;
2. Mixer amplitude mismatch which creates an in-band image;
3. Deviation from quadrature RF phase which creates an in-band image; and
4. Amplitude and phase mismatch between I and Q reconstruction low pass filters which creates an in-band image.

Improving the performance of ordinary imageless mixers is therefore necessary.

In accordance with another aspect of the invention, these problems are resolved by monitoring the output of the quadrature pair of mixers to determine whether any of the four mentioned parameters is misadjusted. Monitoring is performed either with test signals applied during a calibration phase or during normal program modulation. If the mixers are sensed to be out of adjustment, corrections are made iteratively, preferably with a computer, until performance reaches an acceptable level.

An important aspect of this invention is that, when the mixer system is in perfect adjustment, there is no envelope modulation component whatsoever. Conversely, when there is a misadjustment of any of the four previously-mentioned parameters, an envelope detector detects mixer misadjustment and procedures are followed to correct the misadjustments.

In the presence of modulation, a carrier feedthrough component creates an envelope modulation component having an amplitude directly proportional to the degree of imbalance, and a frequency equal to the instantaneous frequency deviation. An in-band image which occurs during modulation also creates an envelope modulation component having an amplitude proportional to the phase and/or amplitude imbalance, and a frequency equal to twice the instantaneous frequency deviation of the carrier caused by the modulation.

At an instant when there is an FM carrier deviation having a positive value of $f_a$ kHz above the carrier frequency, there can be two primary undesired artifacts: (1) a carrier feedthrough component at the unmodulated carrier frequency, $f_c$, and (2) an in-band image of the positive carrier deviation; the in-band image appears at a frequency $f_a$ away from the unmodulated carrier frequency, where $f_a$ is the desired modulation frequency; the inband image is on the opposite side of $f_c$ from the desired instantaneous signal. For example, if a "DC" modulation signal is applied which would cause the carrier to deviate a constant +75 kHz, then any carrier feedthrough would result in a 75 kHz envelope beat note which is recovered by the envelope detector. Similarly, an in-band image would result in a 150 kHz beat note.

Performance monitoring of the mixer pair is performed with this kind of test signal which establishes a "DC" modulation condition. This has the advantage that there cannot be any slope detection as a result of deliberate or incidental RF filtering. (Slope detection can introduce an envelope component into an otherwise perfect FM signal; however, if the modulation is DC, there cannot be any slope detection.)

Adjustment is performed by:
1. Applying DC modulation at a first relatively low predetermined deviation frequency, e.g., 1 kHz.
2. Detecting a beat note at the first predetermined deviation frequency; iteratively adjusting mixer offsets to minimize beat note at the first predetermined deviation frequency from carrier feedthrough.
3. Changing deviation to a second relatively low predetermined deviation frequency that is one-half the first frequency deviation, e.g., 500 Hz.
4. Iteratively adjusting the Q amplitude and RF phase to minimize beat at the first predetermined deviation frequency (e.g. 1 kHz) from an in-band image.
5. Changing deviation to a third relatively high predetermined deviation frequency, e.g., 75 kHz.
6. Detecting a beat note at twice the third predetermined deviation frequency; adjust Q channel baseband delay to minimize the beat at twice the third predetermined deviation frequency.
7. Repeating steps 1–6 several times because of adjustment interaction.

These adjustments can be performed in either the analog or the digital domain. In the digital domain, the adjustments are accomplished by:
1. Correcting offsets by adding a small numerical offset to I and Q outputs of the digital synthesizer.
2. Delaying adjustment by interpolating a new sample between two existing samples. This is done by a simple first order interpolation filter, or a more complex filter.
3. Adjusting phase by adding or subtracting a small amount of either the I or Q signal to the other.
4. Correcting gain mismatch by adjusting the relative gain of the I and Q channels.

These same adjustments can also be performed under broadened (program) conditions. To do this, slope detection is minimized or eliminated. The envelope detector produces only the beat notes and not any slope detected program modulation.

Signal integrity can be and is only evaluated in the presence of modulation. During program pauses, particularly during monaural operation where there is no pilot, it is not possible to detect beat notes. If slope detection is eliminated the only envelope modulation will be caused by mixer imbalance and I/Q mismatch.

A first method of adjusting the mixers under program conditions simply involves measuring the amount of envelope modulation. This adjustment process adjusts each of several parameters (DC offset of the modulating wave, amplitude of the modulating wave and delay times of the I and Q channels) and looks for less envelope modulation, no change, or greater envelope modulation of the output signal. If there is less envelope modulation, the adjustment is kept. If there is no change or increased envelope modulation, the adjustment is rejected. Averaging mitigates any slope detection, changing program characteristics, or program pause effects.

A second method improves on the first method by adding selectively switched highpass and lowpass filters after the envelope detector. The highpass and lowpass filters respectively have cutoff frequencies of approximately 30 kHz–100 kHz and 1 kHz–10 kHz. A similar iterative adjustment procedure is followed, except that the lowpass filter is switched in when adjusting mixer DC offsets, I/Q gain differential, and I/Q phasing. The highpass filter is switched in when adjusting I/Q differential delay. Use of the frequency discriminating highpass and lowpass filters shortens adjustment time and increases adjustment accuracy.

In a third adjustment method, using additional hardware and signal processing, only the instantaneous frequency of the carrier feedthrough beat note or the in-band image beat note is detected, to reject any unwanted slope detection components. In this method, quadrature phased signals are formed at the instantaneous beat note frequency, which is either equal to the instantaneous deviation or twice the instantaneous deviation. The quadrature phased signals are used to detect a beat note. The AC component of the envelope signal is multiplied by the two quadrature phased signals. Each resulting product is lowpass filtered. The vector sum (square root of the sum of the squares) of the lowpass filter products is derived, preferably in the digital signal processor, to detect the beat note amplitude. The I and Q signals, which are quadrature phased signals at the instantaneous deviation frequency, are used to detect the carrier feedthrough envelope modulation beat note.

There are several ways to form quadrature phased signals at twice the deviation frequency, all involving products or squares of I, Q, or sums and differences thereof. One way is to multiply I times Q. This produces a double frequency component with no DC term.

If $$I(t)=\cos\{p(t)\}$$

where p(t)=angle modulation function, $$2*I(t)*Q(t)=\cos\{p(t)\}*\sin\{p(t)\}=\sin\{2*p(t)\}$$

and $$\{I(t)+Q(t)\}*\{I(t)-Q(t)\}=\{\cos\{p(t)\}+\sin\{p(t)\}\}*\{\cos\{p(t)\}-\sin\{p(t)\}\}=-\cos\{2*p(t)\}$$

These two products are quadrature phased signals at twice the instantaneous deviation frequency.

To form these signals as described, several multipliers are necessary. In addition, the subsequent detectors also employ multipliers. To eliminate the multipliers and simplify the circuitry, the products are converted to squarewaves by an analog comparator, whereby the beat detector has an output with odd harmonics of its intended frequency. However, there will not normally be any significant energy at the odd harmonic frequencies, making the result similar. Analog multipliers are expensive, complicated, and subject to offsets and other inaccuracies. By comparison, analog comparators and switching modulators are less expensive, simpler, and can be made very accurate with very low offsets.

Instead of forming a squarewave from the sinusoidal products, another embodiment employs comparators and logic circuitry to form the squarewave without using multipliers. To form the squarewave signum $\{\sin\{2*p(t)\}\}$ (where signum is the sign function), analog comparators form the signum function of the I signal, the signum function of the Q signal, and exclusive-OR the two signum functions. The result is a squarewave at twice the instantaneous deviation frequency. To obtain the quadrature phased squarewave at twice the instantaneous deviation frequency, the exclusive OR signum functions (I+Q) and (I−Q) is derived. These squarewaves are drive signals for simple switching modulators.

The digital signal processor, instead of analog comparators, can form the switching signals from the analog I and Q signals. However, the digital signal processor (DSP) adds a small amount of jitter because it has a finite sampling rate of the analog I and Q signals.

Most or all of this envelope signal processing may be done in DSP. In the DSP case, the AC component of the envelope signal is digitized using an analog to digital converter, have an output supplied to the DSP. The DSP detects the beat notes at one and two times the instantaneous deviation frequency. The process is essentially the same as it is in analog, except that true multiplication based detection is preferred over the use of signum functions (comparators) and switching modulator detection. The latter method, which is attractive in analog signal processing, could cause aliasing in DSP. The former method, using multipliers, is accurate and efficient in DSP.

When the modulator uses dynamic adjustment during program conditions, only a single mixer system is necessary. However, when "DC" test signals are used to recalibrate and adjust the mixer system from time to time, two mixer systems are necessary to avoid program interruptions. When one system is "on air," the other is available for calibration.

In such a dual mixer system arrangement, the outputs of the two mixer systems are preferably combined when one mixer system is not being calibrated. If the residual in-band images and carrier feedthrough components are at random phases and amplitudes, a 3 dB performance improvement occurs.

It is possible to increase the number of phases from two {0 degrees (I) and 90 degrees (Q)} to any larger number. Statistically, increasing the number of phases improves system performance because the voltages (or currents) from each phase add coherently and linearly, but the undesired images and feedthrough components have random phases and amplitudes, so only their powers add.

Further improved performance can be attained by operating the direct conversion mixers at a harmonic (N) of the operating frequency, increasing the deviation by a factor of N, and dividing the output frequency by a factor of N in a digital divider. This reduces the spurious noise by a factor of N, assuming mixers etc. perform as well at the harmonic frequency as at the fundamental. The reduction in spurious noise is 20* log 10(N)dB.

Hence, one aspect of the invention relates to a method of operating an angle modulated transmitter responsive to a signal representing speech and/or music broadcast information and a carrier having a frequency at a carrier frequency for the transmitter wherein there are derived analog sinusoidal waves, each having (a) a substantially constant maximum amplitude that is about the same for each wave, (b) the same angle determined by the broadcast information, and (c) different phases nominally displaced from each other by a predetermined angle. Analog processing circuitry, responsive to the analog sinusoidal waves and the carrier, derives an output wave having a carrier frequency that is frequency modulated by the broadcast information. The amplitude and phase angle of the analog sinusoidal waves are controlled to provide compensation for differential variations having a tendency to be imposed by the analog processing circuitry on the analog sinusoidal waves and which tend to degrade the output wave.

In one preferred embodiment, DC offset of the sinusoidal waves is controlled by causing each sinusoidal wave to have a first constant frequency. Then a DC offset of each sinusoidal wave is adjusted until envelope amplitude variations at the first constant frequency of the output wave are minimized. The maximum AC amplitude of the sinusoidal waves is controlled by causing each sinusoidal wave to have a second constant frequency, preferably one-half of the first frequency. Then the relative maximum amplitude of the sinusoidal waves is adjusted until the output wave envelope amplitude variations at a frequency twice the second frequency are minimized. The relative phase of the sinusoidal waves at the second frequency is controlled until the output wave envelope amplitude variations at the second frequency are minimized. To control relative delay from a source of the sinusoidal waves to the mixing arrangement, the sinusoidal frequency is changed to a third value. The amount of relative delay at a frequency equal to twice the third frequency is then adjusted until envelope amplitude variations of the third frequency are minimized. If envelope amplitude variations of the output at a selected one of these three frequencies decrease as a result of the operations, the operations are repeated. The process is continued until there is no further decrease in output wave envelope variations.

The invention also relates to a radio transmitter for a signal representing speech and/or music broadcast information to be angle modulated on a carrier having a frequency at a carrier frequency for the transmitter. The transmitter comprises digital processing circuitry responsive to a source of a first digital signal having an amplitude determined by sequential samples of the amplitude of the broadcast information. The digital processing circuitry derives plural digital output signals each having a sequence of values representing a sinusoidal wave having a substantially constant maximum amplitude and a baseband frequency determined approximately by the amplitudes of the sequential samples. Each of the digital signals approximately represents a different phase of the sinusoidal wave. The digital processing circuitry converts the plural digital signals into plural analog baseband sinusoidal signals, each having (a) a substantially constant maximum amplitude, and (b) a baseband frequency and phase respectively determined by the different derived digital output signals. Analog processing circuitry responsive to the analog baseband sinusoidal signals and the carrier derives an angle modulated output wave having a carrier frequency that is angle modulated by the broadcast information.

Another aspect of the invention relates to a radio transmitter for a signal representing speech and/or music broadcast information to be frequency modulated by a carrier having a frequency at a carrier frequency for the transmitter. The transmitter comprises digital processing circuitry responsive to a first digital signal having an amplitude determined by sequential samples of the amplitude of the broadcast information. The digital processing circuitry derives plural digital output signals each having a sequence of values representing a sinusoidal wave having a substantially constant maximum amplitude and an angle determined approximately by the sequential samples. Each of the digital signals approximately represents a different phase of the sinusoidal wave. The digital processing circuitry converts the plural digital signals into plural analog sinusoidal signals, each having (a) a substantially constant maximum amplitude, and (b) an angle and phase respectively determined by the different derived digital output signals. Analog processing circuitry responsive to the analog sinusoidal signals and the carrier derives an angle modulated output wave having a carrier frequency that is angle modulated by the broadcast information. The digital processing circuitry controls the values of the digital output signals so compensation is provided for differential variations having a tendency to be imposed by the analog processing circuitry on the analog sinusoidal signals and which tend to degrade the output wave.

An additional aspect of the invention relates to a radio transmitter for a signal representing speech and/or music broadcast information to be angle modulated by a carrier having a frequency at a carrier frequency for the transmitter. The transmitter comprises digital processing circuitry responsive to a first digital signal having an amplitude determined by sequential samples of the amplitude of the broadcast information. The digital processing circuitry derives plural digital output signals each having a sequence of values representing the phase of a sinusoidal wave having a substantially constant maximum amplitude and a frequency determined approximately by the sequential samples. Each of the digital signals approximately represents a different phase of the sinusoidal wave. The digital processing circuitry includes a memory loaded with values representing plural Taylor series coefficients at many different phases of a baseband sinusoidal wave. The coefficients are read out in response to the most significant bits representing the phase of the sinusoidal wave and are combined with other phase representing bits to derive the amplitude(s) of the other coefficients. As the number of coefficients increases, the storage requirements diminish, but the computation requirements increase.

In the preferred embodiment, the memory stores amplitude and slope values at the many different phases of the sinusoidal wave. The digital processing circuitry (a) reads the amplitude and slope values from the memory as a function of amplitudes of the sequential samples, and (b) combines the read amplitude and slope values to determine an instantaneous approximate amplitude of each of the sinusoidal waves. The plural digital signals are converted into plural analog sinusoidal signals, each having (a) a substantially constant maximum amplitude, and (b) a frequency and phase determined by the different derived digital output signals. Analog processing circuitry responsive to the analog baseband sinusoidal signals and the carrier derives an angle modulated output wave having a carrier frequency that is angle modulated by the broadcast information.

A further aspect of the invention relates to a method of operating a radio transmitter responsive to a signal representing speech and/or music broadcast information and a carrier wave having a frequency at a carrier frequency for the transmitter, wherein there is digital processing of a first digital signal having an amplitude determined by sequential samples of the amplitude of the broadcast information. The digital processing results in plural digital output signals each having a sequence of values representing a sinusoidal wave having a substantially constant maximum amplitude and a baseband frequency determined approximately by the amplitudes of the sequential samples. Each of the digital signals approximately represents a different phase of the sinusoidal wave. The plural digital signals are converted into plural analog baseband sinusoidal signals, each having (a) a substantially constant maximum amplitude, (b) a baseband frequency determined by the different derived digital output signals and (c) a phase determined by one of the derived digital outputs. In response to the analog baseband sinusoidal signals and the carrier wave there is derived a frequency modulated output wave having a carrier frequency, frequency modulated by the broadcast information.

Another aspect of the invention relates to an apparatus for and method of driving an output device with a single sideband modulated output signal having a frequency at a carrier frequency plus or minus a modulation frequency determined by an input. Each of plural channels responds to a sinusoidal like wave having variations determined by the amplitude of the input, wherein each wave has a designed nominal phase difference. Each of plural mixers is responsive to a different one of the sinusoidal like waves and to a different phase at the carrier frequency. Each mixer derives a separate mixed output signal. The mixed output signals are linearly coupled together to derive the single sideband modulated output. The channels, mixers, and circuitry associated with them have a tendency to introduce unwanted components in the single sideband output. Processing circuitry is responsive to a replica of the output while the output is being supplied to the output device. The processing circuitry adjusts at least one of (a) the channels, (b) the amplitude and (c) the phase of the sinusoidal like waves such that at least one of the unwanted components is substantially not present in the output wave.

The above and still further objects, features and advantages of the present invention will become apparent upon consideration of the following detailed descriptions of several embodiments thereof, especially when taken in conjunction with the accompanying drawings.

DETAILED DESCRIPTION OF THE DRAWING

Figure 1:
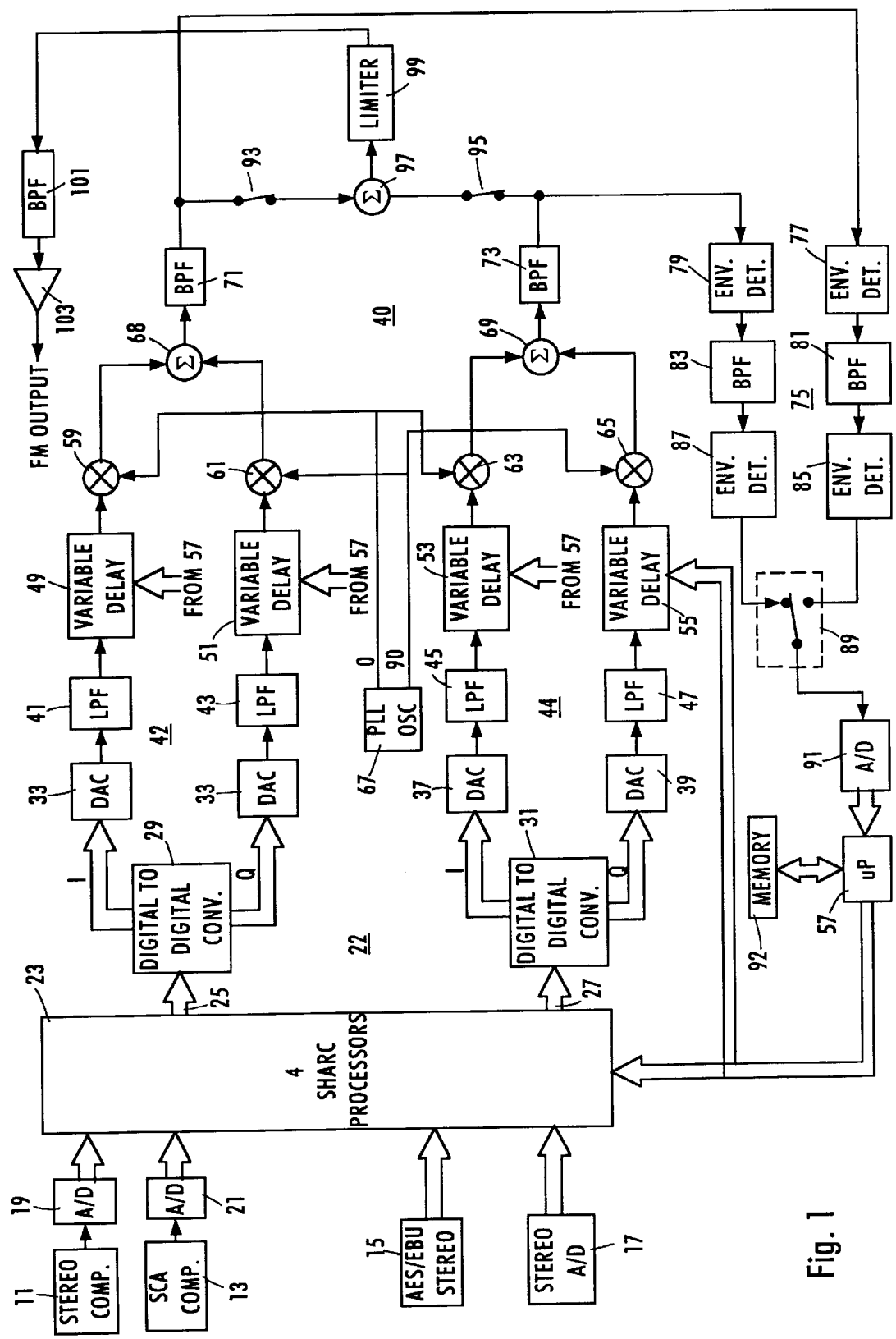
FIG. 1 is a block diagram of a preferred embodiment of the invention.

Reference is now made to FIG. 1 wherein four channels, each containing audio (i.e. speech and/or music) broadcast information, are respectively supplied to stereo composite processor 11, Subsidiary Communications Authorization (SCA) composite processor 13, Audio Engineering Society/European Broadcast Union (AES/EBU) stereo processor 15 and AES/EBU SCA 1 & 2 processor 17. Processors 11 and 13 derive analog signals which are respectively converted into 16-bit digital signals by analog to digital converters 19 and 21. Processors 15 and 17 derive 16-bit digital signals. The 16-bit signals represent analog audio signals having a predetermined voltage range, e.g., −1 volt to +1 volt. The output signals of analog to digital converters 19 and 21, as well as processors 15 and 17, are supplied to digital processing circuitry 22 including digital floating point processor 23, digital-to-digital converters 29 and 31 and digital-to-analog converters 33–39.

Digital-to-analog converters 33–39 drive analog processing circuitry 40 which derives a carrier wave at the frequency of source 67. The carrier wave is frequency modulated by the audio information supplied by one of sources 11–17 to digital processing circuitry 22. In the United States, the carrier wave has a frequency in the range of 88.1 to 107.9 MHz and is frequency modulated over a range from −75 kHz to +75 kHz in response to an analog audio signal varying between its peak negative and positive voltages.

Analog processing circuitry 40 includes two substantially identical sections 42 and 44. Normally both of sections 42 and 44 operate at the same time and the outputs thereof are linearly combined, i.e. added, to produce the wave to be transmitted. To calibrate one of sections 42 or 44, the other section is decoupled from the transmitter output. Because of the redundancy of sections 42 and 44, the following discussion is generally devoted only to section 42 and the portion of digital processing circuitry 22 which drives it. It is to be understood that the operations described for section 42 and the portions of circuitry 22 which drive it are applicable to section 44 and the portions of circuitry 22 which drive it.

In a preferred embodiment, digital processor 23 includes four "Super Harvard Architecture Computer Chips" (SHARCS) of a type available from Analog Devices. Processor 23 responds to the digital input signals supplied to it to derive two 16-bit digital output signals on bus 25. The signals on bus 25 have a word rate of 2.432 MHz. (Processor 23 also supplies two 16-bit digital output signals to bus 27; the signals on bus 27 nominally have the same value as the signals on bus 25 and are not usually discussed hereafter.) The digital signals on bus 25 represent the amplitudes in the orthogonal I and Q phases of the sinusoidal signals derived from audio broadcast information supplied to processor 23. The digital signal on bus 25 is a time interleaved signal so that during certain time slots bus 25 carries a 16-bit signal having an amplitude representing a cosine (I channel) wave having a frequency approximately directly proportional to the amplitude of the broadcast information supplied by one of sources 11–17 to processor 23. During the remaining time slots, bus 25 carries a 16-bit signal having an amplitude representing a sine (Q channel) wave having a frequency approximately directly proportional to the amplitude of the broadcast information supplied by one of sources 11–17 to processor 23.

In a preferred embodiment, processor 23 samples the broadcast information at a frequency of 38 kHz. Processor 23 is programmed to perform multiple interpolations so for each input sample there are 128 output samples. Sixty-four of the 128 digital values represent the instantaneous amplitude of a first (I channel) sinusoidal wave having a predetermined maximum amplitude and a frequency, at baseband, directly proportional to the sampled and interpolated values.

The remaining 64 digital values represent the instantaneous amplitude of a second (Q channel) sinusoidal wave having approximately the same predetermined maximum amplitude as the I channel wave and the same frequency as the I channel wave. To produce these results, processor 23 is programmed to perform operations disclosed particularly in FIG. 4 of a paper entitled "A Digital Frequency Synthesizer," IEEE Transactions Audio Electroacoustics, Vol. AU-19, pp. 48–56, March 1971 (Tierney et al.).

If analog processing circuitry 40 were perfect, the I and Q channel representing signals derived by processor 23 would (1) have an average value of zero, (2) be phase displaced by exactly 90° and (3) have exactly the same peak to peak amplitudes at a predetermined value. However, because analog processing circuitry 40 is not perfect, the I and Q channel baseband sinusoidal wave representing outputs of processor 23 have DC offsets, are usually not displaced by exactly 90° and have somewhat different peak to peak amplitudes. An important feature of the invention is that processor 23 is arranged to produce I and Q baseband sinusoidal wave representing outputs having controlled DC offsets, controlled phase displacements and controlled peak to peak amplitudes to compensate for the imperfections in analog processing circuitry 40.

In the preferred embodiment, processor 23 includes a random access memory (RAM) that is loaded with 12-bit digital words representing (1) sine and cosine amplitudes and (2) sine and cosine slopes at 2048 equispaced phase positions, differing by θ, along one cycle of a sinusoidal wave having a unit peak amplitude. The RAM in processor 23 includes two sections, one to store the amplitude and slope values for analog processing section 42 and a second to store the amplitude and slope values for analog processing section 44. This is necessary because sections 42 and 44 usually require different degrees of compensation. If higher order Taylor series coefficients are employed, they are stored in different tables or sections of RAM.

Figure 4:
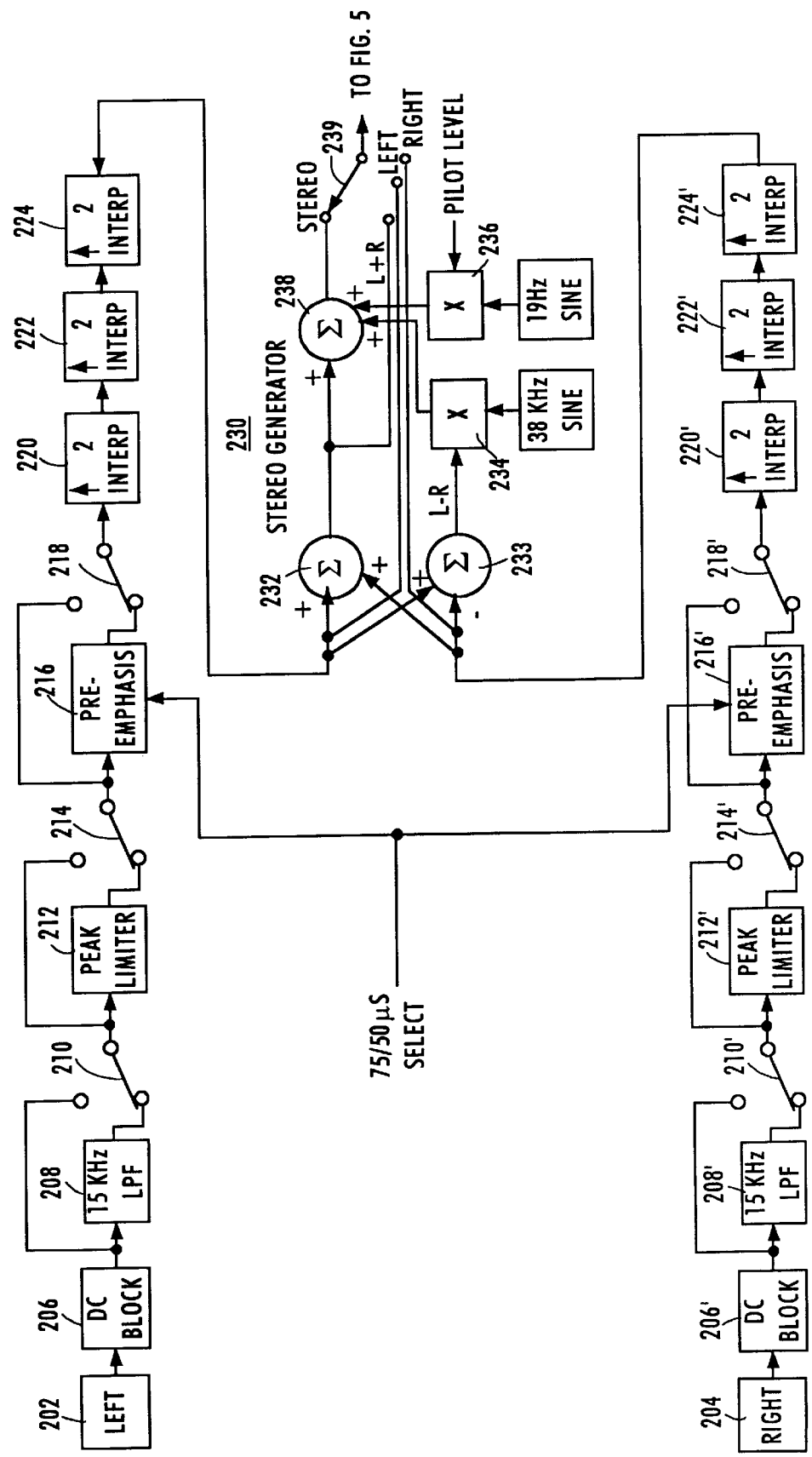
FIGS. 4 and 5 together are a flow diagram of some of the operations performed by the SHARCs of FIGS. 2 and 3.

The RAM phase position is addressed by the 11 most significant bits of a 32-bit integer accumulated phase representing input signal ($\theta_i$) similar to that disclosed in FIG. 4 of Tierney et al. To derive the values of $\sin\theta_i$ and $\cos\theta_i$, interpolated to better accuracy than the 2048 16-bit samples stored in RAM, a CPU of one of the SHARCs of processor 23 combines the values of the sine amplitude and slope and of the cosine amplitude and slope at the addressed phase by using the Taylor series approximation $$y = f(a) + (\theta_i - a)f'(a)$$

where y is the amplitude of the sine or cosine wave for the value $\theta_i$, f'(a) is the derivative (slope) of the sinusoidal wave at the phase position ($\theta_1$) in the RAM closest to and less than $\theta_i$, a=exact angle for which the sine or cosine value is desired, and $\theta_i$ is the value of "a" rounded to the closest value in $2\pi/2048$ phase increments in the RAM.

By using a RAM that stores sinusoidal amplitudes and slopes, the CPU of processor 23 determines the value of y to 16-bit accuracy (equivalent to 131,072 phase entries in the table) even though the RAM only has 2048 phase entries each for the sine, cosine and slope values, thereby providing a considerable reduction in RAM requirements over a 131,072 word RAM. The amplitude and slope values in the RAM differ from the theoretical values thereof to compensate for the imperfections in analog processing circuitry 40. As a result, the digital I and Q channel sinusoidal baseband representing signals derived by processor 23 on buses 25 and 27 are not usually exactly 90° displaced from each other and do not usually have exactly the same peak to peak amplitudes or DC offsets. Because the amplitude and slope values are stored in the RAM (i.e., software) of processor 23, these values are easily changed. Such changes can be accomplished much more easily and faster than would be the case with a full RAM table containing 131,072 entries. Moreover, a read only memory (ROM) table can not be changed. By using the Taylor series approximation, there is a need to calculate only 4,096 values for each sine and cosine, rather than 131,072 values.

The signals on buses 25 and 27 are respectively supplied to digital-to-digital converters 29 and 31. Each of digital-to-digital converters 29 and 31 separates the time interleaved sine and cosine digital information supplied to it via buses 25 and 27 into two 16-bit I and Q digital signals, each having the 2.432 MHz word rate and representing the instantaneous amplitude of the orthogonal components of the audio broadcast information supplied to processor 23.

The I and Q digital output signals derived from digital to digital converter 29 are respectively applied to digital to analog converters 33 and 35, while the I and Q output signals of digital to digital converter 31 are respectively applied to digital to analog converters 37 and 39. The analog output signals of digital-to-analog converters 33–39 are respectively applied to sections 42 and 44 of analog processing circuitry 40, in particular to analog low pass reconstruction filters 41, 43, 45 and 47. Each of filters 41, 43, 45 and 47 is a lowpass filter having a cutoff frequency sufficient to handle the highest sideband frequency in the spectra respectively derived from converters 33, 35, 37 and 39. Simple low pass filters 41–47 can be employed because of the oversampled digital signals, representing baseband sinusoidal waves, applied to digital-to-analog converters 33–39.

The output signals of low pass filters 41, 43, 45 and 47 are respectively applied to digitally controlled allpass delay line filters 49, 51, 53 and 55. The delay times of filters 49–55 are controlled by an output signal of microprocessor 57, preferably a 486 microprocessor available from Intel Corporation. The gain of a multiplying D to A converter in each of filters 49–55 is adjusted to change the filter delay time for time delay calibration so that the I channel outputs of signals derived from filters 49 and 53 have about the same phase and the Q channel outputs of filters 51 and 55 have about the same phase. The output signals of filters 49–55 are variable frequency baseband sinusoidal signals having approximately constant, equal positive and negative peak amplitudes.

The output signals of filters 49, 51, 53 and 55 are respectively applied to one input of each of balanced mixers 59, 61, 63 and 65. There are DC paths between the sinusoidal wave outputs of converters 33–39 and the inputs of mixers 59–65 so the DC offsets applied to the sinusoidal waves derived by the converters propagate to the inputs of the mixers to provide compensation for DC offset effects introduced by the mixers and the circuitry connected to them. Mixers 59 and 63 have a second input driven in parallel by a zero phase output of phase locked loop oscillator 67, having an output frequency equal to the carrier frequency of the FM transmitter. The other input of each of mixers 61 and 65 is responsive to an output of phase locked loop oscillator 67 that is nominally phase shifted 90° with respect to the zero phase output of the oscillator. In actuality, the carrier inputs to mixers 59–65 are usually not exactly in phase or phase displaced by 90° from each other because the outputs of oscillator 67 are not exactly orthogonal to each other and the propagation times from the oscillator to all of the mixers are not exactly the same.

The resulting mixed output signals of mixers 59 and 61 are added together in analog summer 68, while the mixed output signals of mixers 63 and 65 are added together in analog summer 69. The output signals of summers 68 and 69 are respectively supplied to analog bandpass filters 71 and 73. Each of bandpass filters 71 and 73 has a bandpass and center frequency consistent with the FM band of the country where the transmitter is operating; 88.1-107.9 MHz in the United States.

If section 42 is operating perfectly with a DC (constant) modulating signal, the output of filter 71 can be represented by:

$$A \cos \omega_c t \cos \omega_a t + A \sin \omega_c t \sin \omega_a t = A \cos (\omega_c - \omega_a) t \quad (1)$$

where t=time $\omega_c = 2\pi f_c$ $\omega_a = 2\pi f_a$ $f_c$=carrier frequency of oscillator 67

$f_a$=baseband output frequency of processor 23 directly proportional to the instantaneous amplitude of the DC program information modulating signal.

As the DC value of the modulating signal goes positive and negative the value of $f_a$ goes negative and positive to provide frequency modulation of $f_c$. ($f_c$ is negative when the Q channel output of DAC 39 phase leads the I channel output of DAC 37.)

Because of imperfections in section 42, the output of filter 71 is generally more accurately represented by $$\{P_1 + D_1 + B_1 C_1 \cos (\omega_a t)\} \cos (\omega_c t) + \{P_2 + D_2 + B_2 C_2 \sin (\omega_a \{t + t_\Delta + t_c\} + \phi_1 + \theta_1)\} \sin (\omega_c t + \theta_2) \quad (2)$$

$t_{66}$=differential time delay error in the I and Q channels of section 42, $t_c$=time delay correction, $\phi_1$=Q channel modulation phase error, $\theta_1$=Q channel modulation phase correction, $P_1$=I channel mixer offset, $D_1$=I channel offset correction, $P_2$=Q channel mixer offset, $D_2$=Q channel offset correction, $B_1$=I channel gain, $C_1$=I channel gain correction, $B_2$=Q channel gain, $C_2$=Q channel gain correction, $\phi_2$=carrier quadrature phase error.

The carrier is nulled by making $D_1 = -P_1$ $D_2 = -P_2$.

Time delay is corrected by making $t_c=-t_A$.
Then the sum becomes equal to:

$$\frac{B_1 C_1}{2}\cos\{(\omega_c + \omega_a)t\} + \frac{B_1 C_1}{2}\cos\{(\omega_c - \omega_a)t\} -$$
$$\frac{B_2 C_2}{2}\cos\{(\omega_c + \omega_a)t + \phi_1 + \theta_1 + \phi_2\} +$$
$$\frac{B_2 C_2}{2}\cos\{(\omega_c - \omega_a)t - \phi_1\theta_1 + \phi_2\};$$

to cancel the $(\omega_c+\omega_a)$ component, make:

$C_1=2/B_1$
$C_2=2/B_2$ and $\theta_1=-\phi_1-\phi_2$.

The corrected output is $$\frac{1}{2}\cos\{(\omega_c - \omega_a)t\} + \frac{1}{2}\cos\{(\omega_c - \omega_a)t\}\cos(\phi_1 + \theta_1 - \phi_2) +$$
$$\frac{1}{2}\sin\{(\omega_c - \omega_a)t\}\sin(\phi_1 + \theta_1 - \phi_2) =$$
$$\frac{1}{2}\cos\{(\omega_c - \omega_a)t\} + \frac{1}{2}\cos\{(\omega_c - \omega_a)t - \phi_1 - \theta_1 + \phi_2\}.$$

To achieve these values of $t_c$, $\theta_1$, $D_1$, $D_2$, $C_1$ and $C_2$, the output signals of bandpass filters 71 and 73 are respectively applied to envelope detectors 77 and 79 of detection circuity 75. Envelope detectors 77 and 79 derive DC signals directly proportional to the AC peak signals derived by filters 71 and 73. The output signals of detectors 77 and 79 are respectively applied to bandpass filters 81 and 83. While $D_1$, $D_2$, $C_1$, $C_2$ and $\theta_1$ are adjusted, analog filters 81 and 83 have a center frequency of 1 kHz and a bandpass of about 100 Hz; for the time delay adjustments, filters 81 and 83 have a center frequency of 200 kHz and a bandpass of about 20 kHz, to pass a 200 kHz tone.

The output signals of bandpass filters 81 and 83 are respectively applied to analog envelope detectors 85 and 87. Envelope detectors 85 and 87 derive DC signals directly proportional to the peak amplitudes of the AC signals derived by bandpass filters 81 and 83. The output signals of envelope detectors 85 and 87 are applied, one at a time, via switch 89 to an input of analog to digital converter 91. Analog-to-digital converter 91 responds to the signals coupled through switch 89 to derive a 16-bit digital signal, the 12 most significant bits of which are applied to a 12 bit data input port of microprocessor 57.

Microprocessor 57 responds to signals in memory 92 and to signals derived from converter 91 to (1) determine changes to be made in theoretical amplitude and slope values it calculates for 2048 phase positions of one cycle of a unit sinusoid, (2) control the center frequencies of filters 81 and 83, (3) perform other operations associated with calibrating analog processing circuitry 40 and (4) supply a RAM of processor 23 with digital signals representing the determined amplitude and slope values at the 2048 phase positions. The changes in the theoretical amplitude and slope values are based on the imperfections in analog processing circuitry 40, as indicated by the output of converter 91. The signals microprocessor 57 supplies to the RAM of microprocessor 23, indicative of the changed sinusoidal amplitude and slope values, enable processor 23 to control the relative values of $D_1$, $D_2$, $C_1$, $C_2$ and $\theta_1$.

After microprocessor 57 has loaded the changed sinusoidal amplitude and slope values into processor 23, microprocessor 57 responds to signals in memory 92 and to the output of converter 91 to derive control signals that are applied to variable delay allpass filters 49–55. The signals supplied by microprocessor 57 to variable delay allpass filters 49–55 control the gain of a multiplying D to A converter which in turn controls the amount of time delay these filters impose on the analog signals supplied to them to cause $\phi_1$ to be correct. The time delays provide a frequency-dependent phase difference (time delay) between the sinusoidal waves derived by the delay line filters. This controlled time delay primarily compensates for different delays through the four filters 41, 43, 45 and 47. The time delay has little or no effect on the carrier frequency feedthrough component but primarily affects the amplitude of the in-band image at only the highest instantaneous deviation frequencies. When these operations are performed on sections 42 and 44 they cause the output signals of filters 71 and 73 to be virtually identical.

During normal operation of the FM transmitter illustrated in FIG. 1, switches 93 and 95 are closed so the virtually identical output signals of analog bandpass filters 71 and 73 are linearly combined in analog summer 97. The variable frequency output signal of summer 97 is applied to hard limiter 99, having a constant amplitude output, at a carrier frequency equal to the frequency of oscillator 67, and frequency variations determined by the audio information applied to processor 23. The output of limiter 99 is applied to analog bandpass filter 101, having a bandpass similar to but somewhat different from those of filters 71 and 73. The output of filter 101 is applied to power amplifier 103 which delivers the FM output to an antenna of the transmitter or to a further power amplifier which drives the antenna.

Processor 23 is programmed so the I and Q digital output signals of digital to digital converters 29 and 31 have values indicative of the instantaneous amplitudes of the I and Q channels of the audio broadcast information applied to processor 23.

If, for example, the audio information represents a constant analog signal having a constant value of −1 volt, the I and Q digital output signals of converters 29 and 31 have values respectively representing sine and cosine baseband waves having a frequency of +75 kHz. Under these circumstances, the output signals of converters 29 and 31 represent signals such that the phase of the I channel leads the phase of the Q channel. If the audio information represents a voltage having a value of +1 volt, the I and Q signals derived from converters 29 and 31 have values representing a baseband frequency of −75 kHz. The −75 kHz frequency results from the phase of the Q channel wave leading the phase of the I channel wave.

In another example, assume that the audio signal has a constant value of −0.5 volt, whereby the I and Q output signals of converters 29 and 31 are digital signals representing +37.5 kHz, at baseband; the I channel wave leads the Q channel wave. If the audio information supplied to processor 23 represents a constant value of +0.5 volt, the I and Q output signals of converters 29 and 31 represent sine and cosine waves having a frequency of −37.5 kHz; however, the Q channel wave has a phase that leads the phase of the I channel wave.

If the broadcast information represents an audio signal having a constant zero volt value, as occurs during silent intervals, the I and Q output signals of converters are unvarying digital signals having values representing the same phase position that the accumulator in FIG. 4 of Tierney et al. had immediately prior to the occurrence of the silent interval. Thereby, a finite, non-zero DC voltage is applied to at least one of balanced mixers 59 and 61 by filters 49 and 51, respectively, to assure that the carrier of oscillator 68 is coupled to summer 67 and power amplifier 103.

Figure 2:
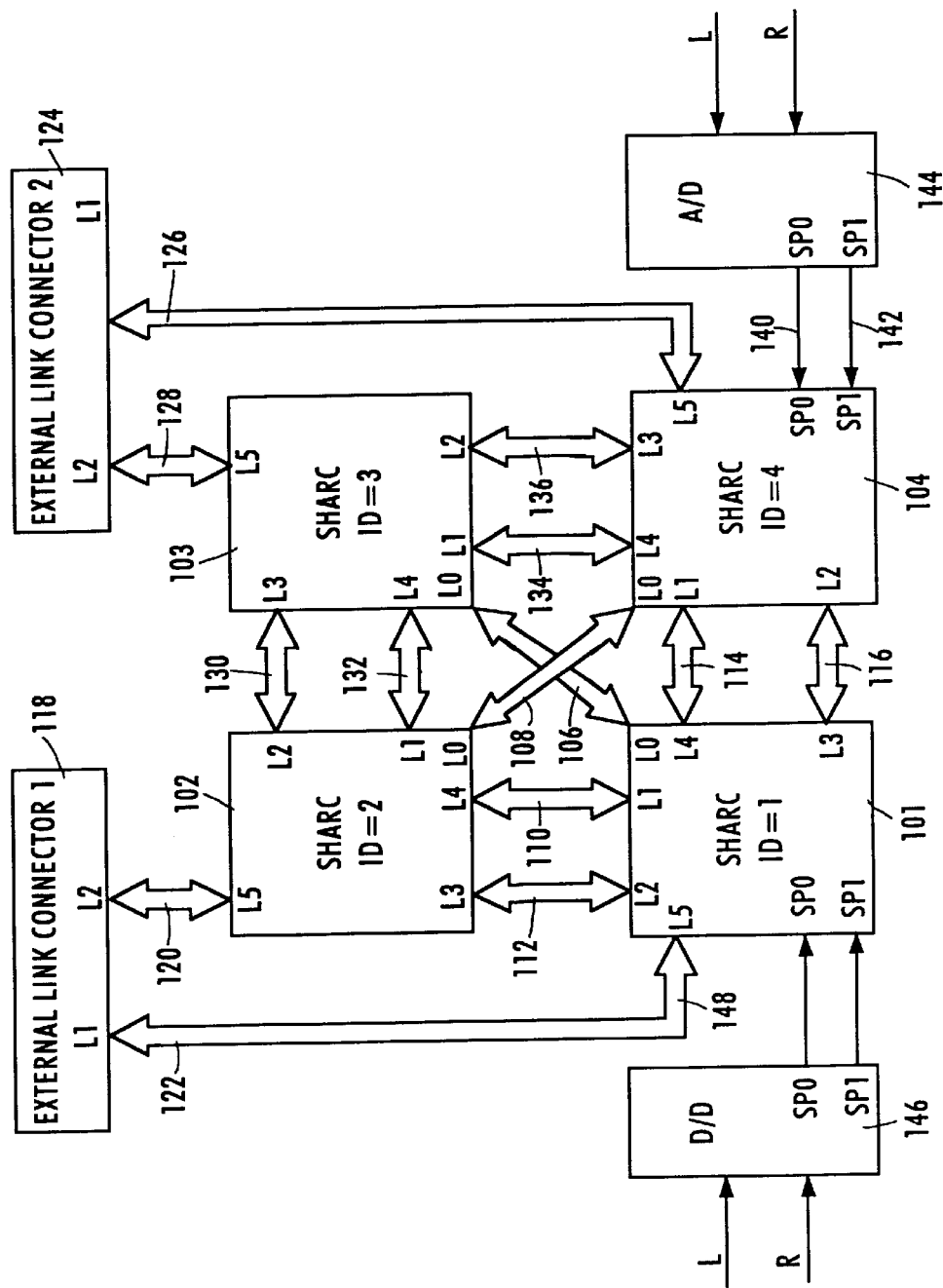
FIG. 2 is a circuit diagram of connections between the four SHARCs of FIG. 1 for the links and serial ports of the SHARCs.

Reference is now made to FIG. 2 of the drawing, wherein the connections between the links and serial ports of the four SHARC processors included in digital processor 23, FIG. 1, are illustrated. The digital processor includes four identical SHARC processors 101–104, each including a 48 bit wide random-access memory (RAM) having a total of about two million bits, an input-output (I/O) bus, and a central processing unit (CPU). Each of the SHARCs operates at a frequency of 33 MHz in response to a 33 MHz clock (not shown). Each SHARC 101–104 includes six links L0–L5, each having 12 parallel bits and two serial ports SP0 and SP1. The physical connections between SHARCs 101–104 are illustrated for completeness. However, many of these connections carry no signals and therefore are not described.

SHARCs 101–104 are programmed and respond to the signals derived from microprocessor 57 as well as from sources 11–17 to derive the 16 bit 2.432 MHz signals that represent instantaneous values of the I and Q channel sinusoids derived by DACs 33 and 35. SHARC 101 is programmed to perform digital operations on the serial 38 kHz word rate digital, audio representing signals derived by digital broadcast sources 15 and 17 and supplied to serial port SP0 of SHARC 101 via lead 148 and digital to digital converter 146, which converts the format of the sources to that of the SHARCs. In the preferred embodiment, illustrated by the flow diagram of FIG. 4, these operations for the left and right channels of sources 15a and 17a are in sequence: DC blocking 206, 206'; 15 kHz lowpass filtering 208, 208'; peak limiting 210, 210'; and pre-emphasis 216, 216'. Operations 206–216 and 206'–216' are not in all instances necessary and can all be removed or can be selectively removed, at the will of the programmer or operator, as indicated by switches 210, 210', 214, 214', 218 and 218'.

SHARC 101 is also programmed to perform three successive interpolation operations 220, 220', 222, 222', 224 and 224' on the signal resulting from the pre-emphasis operations 216, 216', to increase the 38 kHz word rate signal to a 304 kHz word rate signal having 32 parallel bits, i.e., to provide (1) a times eight frequency multiplication factor, and (2) interpolation between the values represented by the adjacent 38 kHz digital words representing the processed audio information. Thereby, the word rate of signals resulting from operations 224, 224', when processed in and supplied by SHARC 101 to other SHARCs in processor 23, is 304 kHz.

SHARC 101 is also programmed to perform operations 230, during which the 304 kHz digital signals representing the left (L) and right (R) channels of the stereo signals from source 15 or 17 are combined. Operations 230 include sum operation 232, difference operation 233, multiplication operation 234, 236 and sum operation 238 to produce digital signals representing amplitudes of waves usually included in an analog baseband FM stereo signal, i.e., (L+R), (L−R) sin (2 $\pi$38000)t, and A sin (2 $\pi$19000)t.

In addition, SHARC 101 is programmed to selectively derive digital signals representing only the left audio channel, only the right audio channel, and the sum of the left and right audio channels, as indicated by switch operation 239. The resulting 304 kHz word rate signal derived from SHARC 101 is applied via bus 114 to link L1 of SHARC 104.

Figure 5:
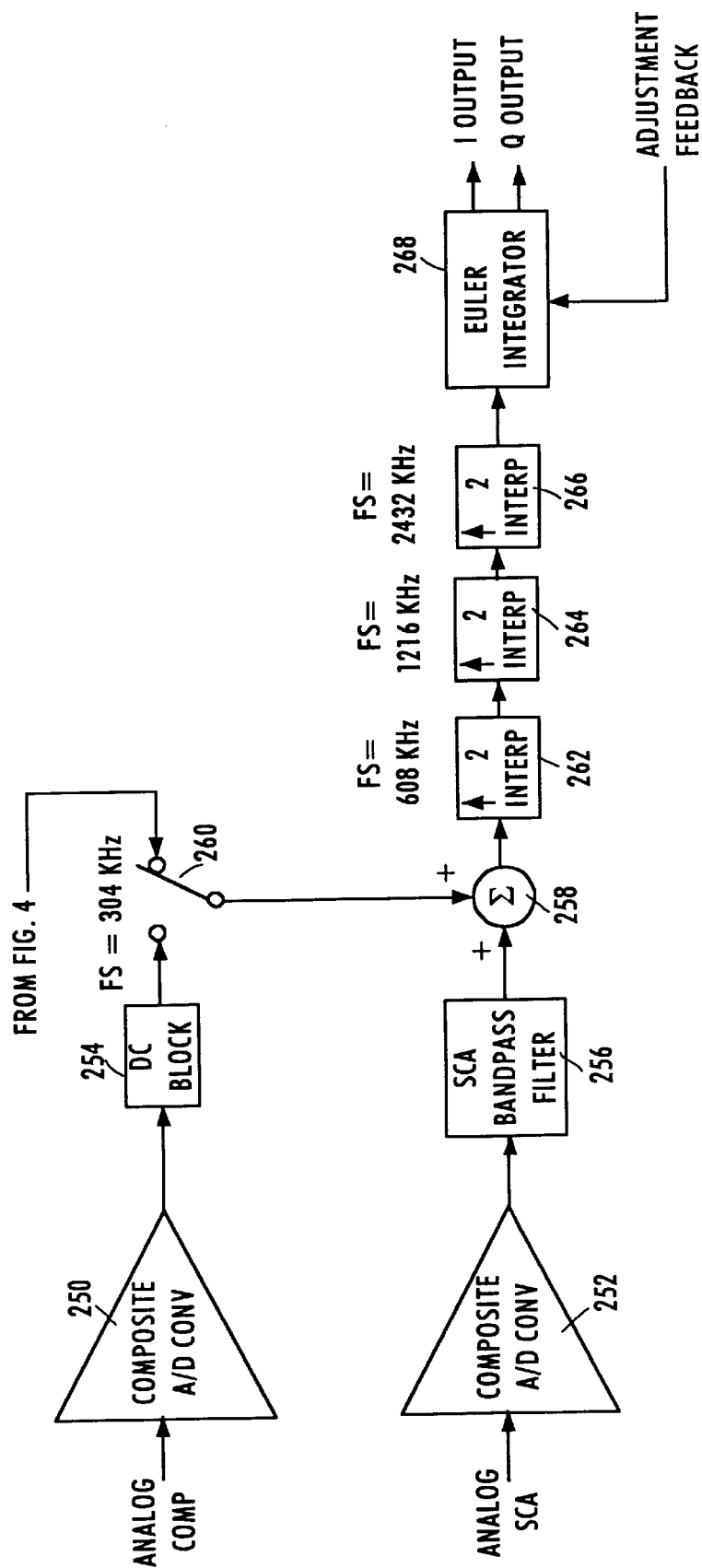

SHARC 104 is also responsive to a 304 kHz word rate serial digital signal derived from analog to digital converter 144 indicative of the amplitude of the signal from one of analog broadcast sources 11 or 13, respectively indicated by operations 250 and 252, FIG. 5. Converter 144 drives serial ports SP0 and SP1 of SHARC 104 with the digital signal via leads 140 and 142 and serial ports SP0 and SP1 of the converter.

SHARC 104 is programmed to provide (1) DC blocking operation 254 (FIG. 5) for the digital signal which represents the output of source 11 and is supplied to SHARC 104 port SP0 and (2) bandpass filtering operation 252 for the digital signal which represents the output of source 13 and is supplied to SHARC 104 serial port SP1. SHARC 104 is programmed to perform operation 258, to sum the 304 kHz digital signal resulting from operation 256 with (1) the 304 kHz signal resulting from DC blocking operation 254 or (2) the 304 kHz signal on bus 114 from SHARC 101 indicative of source 15 or 17. Selection of the signal from operation 254 or from bus 114 is at the will of the operator or programmer, as indicated by switch operation 260.

The resulting sum signal of operation 258 is derived from SHARC 104 at link L4 and supplied via bus 134 to SHARC 103. SHARC 103 is programmed to perform three cascaded interpolation operations 262, 264 and 266 on the signal supplied by SHARC 104 to bus 134 and resulting from sum operation 258. Operations 262–266, together, increase the 304 kHz word frequency output of SHARC 104 to a word frequency of 2.432 MHz and provide interpolation between adjacent values of the 304 kHz words. The 2.432 MHz, 16 bit output of SHARC 103 is supplied by link L1 SHARC 103 to SHARC 102 via bus 132.

SHARC 102 is programmed to perform the accumulate and sinusoidal conversion Euler integration operations 270 of FIG. 4 of Tierney. As a result of operation 270, SHARC 102 derives digital signal representations of the I and Q components of the broadcast information in the analog signal sources derived from source 11 or 13 or the analog signal sources which drive digital source 15 or 17. The I and Q component representing signals are supplied by SHARC 102 to external link connector 118 via bus 120. The RAM of SHARC 102 is loaded by microprocessor 57 with signals for the sine and cosine amplitudes and slopes at 2048 phase positions of the four sinusoidal waves derived from DACs 33–39. The values of these signals are initially calculated by microprocessor 57 from the theoretical values for them and are modified by the microprocessor in response to the calibrating operations (described infra in connection with FIG. 6) performed by the microprocessor to compensate for many inaccuracies of analog processing circuitry 40, FIG. 1. SHARC 102 responds to each accumulated value to address its RAM to read out the amplitude and slope values. The CPU of SHARC 102 combines the read out amplitude and slope values to calculate sine and cosine values, as discussed supra. Because SHARC 102 derives the I and Q values at a 16 bit over sampled word rate of 2.432 MHz, DACs 33–39 include simple lowpass filters to provide smooth sinusoidal wave outputs.

Figure 3:
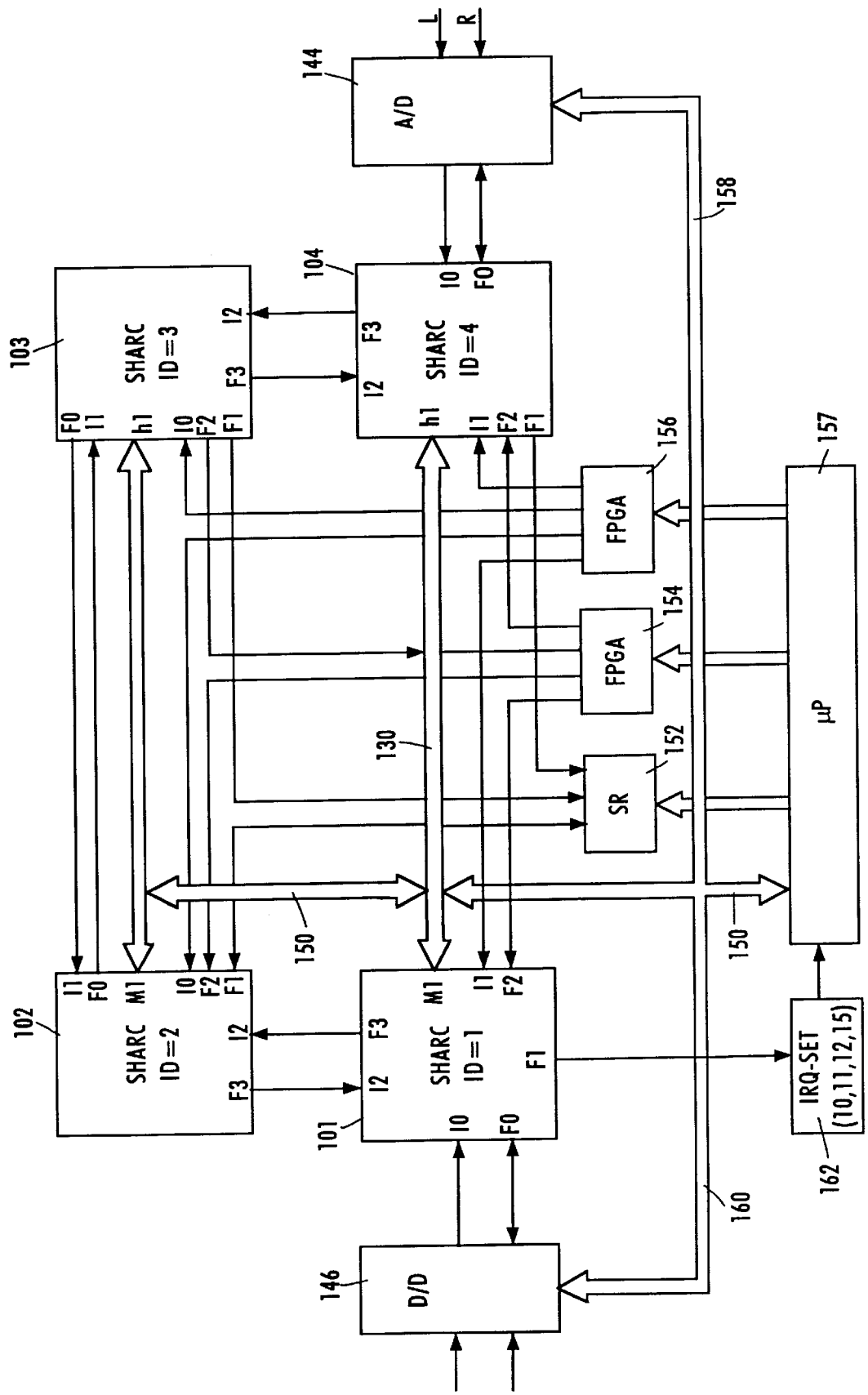
FIG. 3 is a circuit diagram of the four SHARCs of FIG. 1 for the connections of the flags and interrupts that are supplied to and derived from the SHARCs.

Reference is now made to FIG. 3 of the drawing, an illustration of SHARCs 101–104 in combination with microprocessor 57 and connections between the microprocessor and the SHARCs, as well as analog to digital converter 144 and digital to digital converter 146 for flag and interrupt signals that are coupled between these various elements. As illustrated in FIG. 3, each of SHARCs 101–104 includes four flag terminals F0–F3 and three interrupt terminals I0–I2. While physical connections exist between these flag and interrupt terminals, the vast majority of the physical connections are not used.

Each of SHARCs 101–104 includes a memory bus M1 connected to an address input of the RAM of each SHARC. The memory busses M1 of SHARCs 101–104 are connected to each other by bus 150, in turn responsive to signals from microprocessor 57. Thereby, the random access memories of SHARCs 101–104 are loaded with data signals by microprocessor 57, at addresses determined by the microprocessor.

Flag terminals F1 of SHARCs 102–104 supply signals to status register 152 indicative of whether the SHARC associated with the particular terminal F1 is ready to receive and exchange data with other SHARCs and microprocessor 57. Register 152 in turn supplies these signals to microprocessor 57, to assist in controlling operation of the microprocessor and the other SHARCs. Field programmable array 154 responds to microprocessor 57 to selectively supply "OK to go" signals to flag terminals F2 of SHARCs 101–104. (While connections are shown between field programmable gate array 156 and interrupt terminals I1 of SHARCs 101–104, there are no signals coupled via these connections and field programmable gate array 156 is not effective.) Flag terminals F1 of SHARCs 102–104 supply signals to status register 152.

Busses 158 and 160 are connected via bus 150 between microprocessor 57 and analog to digital converter 144 and digital to digital converter 146, to load initial conditions necessary for operation of these converters from the microprocessor into the converters. Flag terminal F1 of SHARC 101 is connected to interrupt request (IRQ) setting circuit 162, having a connection to microprocessor 57. SHARC 101 supplies terminal F1 with a signal if SHARC 101 is in need of immediate service.

Figure 6:
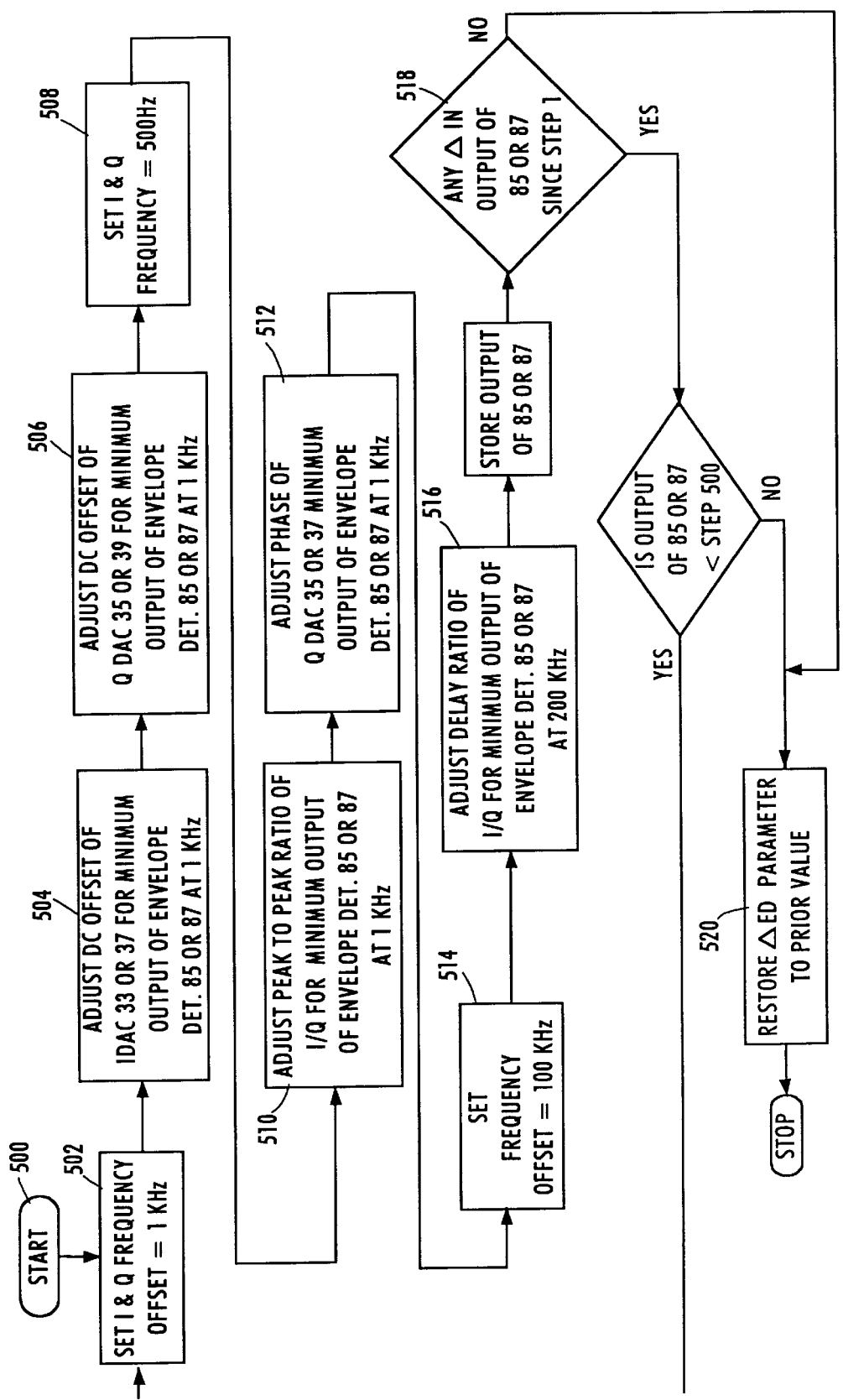
FIG. 6 is a flow diagram of operations performed by a single 486 microprocessor included in the FM transmitter of FIG. 1.

Reference is now made to FIG. 6 of the drawing, a flow diagram of operations memory 92 commands microprocessor 57 to perform to supply processor 23 with signals to balance the differential variations of the components of analog processing circuitry 40. The operations performed by microprocessor 57 for calibration purposes are conducted at the time the transmitter is built, at the factory. In addition, these operations are performed from time to time, on the transmitter while it is in the field. In both instances, the operations are performed at one time only on analog processing circuitry section 42 and are performed at a different time on analog processing circuitry 44.

When the calibrating operations are performed in conjunction with section 42, microprocessor 57 supplies a signal to switch 89, to cause the output signal of envelope detector 85 to be applied to converter 91; conversely, when the operations are performed in conjunction with section 44, microprocessor 57 supplies a signal to switch 89, to cause the output of envelope detector 87 to be supplied to converter 91. If the operations are performed in conjunction with section 42 and the transmitter is in the field, microprocessor 57 supplies a signal to switch 93, to open that switch so the output of bandpass filter 93 is not supplied to power amplifier 103 by way of summer 97, limiter 99 and bandpass filter 101. Conversely, while operations are performed in connection with section 44 and the unit is in the field, microprocessor 57 opens switch 95.

After microprocessor 57 has appropriately activated switches 89, 93 and 95, memory 92 commands microprocessor 57 to respond to the 12 bit output of analog to digital converter 91, in turn responsive to the output of one of envelope detector 85 or 87, as appropriate. (To simplify the description, it is assumed that section 42 is being calibrated, whereby switch 89 is activated so the output of envelope detector 85 is applied to converter 91.)

The first steps in calibrating section 42 after the aforementioned connections have been established by microprocessor 57 are to minimize the values of $P_1$ and $P_2$ in Equation (2). To this end, microprocessor 57 supplies processor 23 with digital signals causing processor 23 to activate digital to analog converters (DACs) 33 and 35 to derive sinusoidal waves that are phase displaced 90° from each other and have a frequency of 1 kHz. Immediately prior to microprocessor 57 activating processor 23 to cause DACs 33 and 35 to derive the 1 kHz sinusoidal waves, the microprocessor activates bandpass filter 81 to cause the filter to have a 1 kHz center frequency.

To control processor 23 so DACs 33 and 35 derive 1 kHz sinusoidal waves, memory 92 is programmed to supply microprocessor 57 with a signal having a value associated with 1 kHz. Microprocessor 57 supplies this signal to SHARC 23, to effectively activate the accumulator of FIG. 4 of the Tierney et al. article with an unvarying digital signal representing 1 kHz. Thereby, digital to digital converter 29 substantially simultaneously supplies DACs 33 and 35 with digital values representing the amplitudes of 2048 phase positions in one cycle of two approximately orthogonal sinusoidal waves, each having a frequency of 1 kHz.

Offset control operation 504 (FIG. 6) of the I channel output of DAC 33 is initiated while microprocessor 57 is causing DACs 33 and 35 to derive approximately 1 kHz orthogonal sinusoidal waves. At this time analog to digital converter 91 supplies microprocessor 57 with a signal representing the output of envelope detector 85. The output of envelope detector 85 indicates amplitude variations at the frequency ($f_c$+1 kHz) as derived from bandpass filter 71. If, at this time, the output of envelope detector 85 is zero, memory 92 is programmed to cause microprocessor 57 to make no changes in the sinusoidal wave representations supplied by processor 23 to DACs 33 and 35 via digital to digital converter 29. If, however, there is a finite, non-zero output amplitude of envelope detector 85 at this time, memory 92 is programmed to cause microprocessor 57 to change the values of the digital signals supplied by processor 23 to DAC 33. To this end, all of the values in the amplitude table in the RAM of SHARC 102 are incremented in the positive direction to increase in a positive direction the DC offset for the sinusoidal wave output of DAC 33. The offset increase is relatively small, e.g. about 0.1% of the peak to peak amplitude of the sinusoidal wave.

Microprocessor 57 then compares the new output of envelope detector 85 with the previous value of the output of the envelope detector, as stored in memory 92. If the comparison indicates there is a decrease in the output of envelope detector 85 (to indicate the last change improved transmitter performance), microprocessor 57 again increases, i.e. increments, in the positive direction the DC offset of the I channel signal processor 23 supplies to DAC 33. (Memory 92 is programmed so each incremental offset change in the signal supplied to DAC 33 is the same.) Then microprocessor 57 again compares the output of the envelope detector with the previous value of the output of the envelope detector, as stored in memory 92. Operation continues in this manner until microprocessor 57 detects an increase in the output of envelope detector 85 or a maximum amplitude of the sinusoidal output of DAC 33 is reached. When microprocessor 57 detects an increase in the output of envelope detector 85, it changes the amplitude values in the cosine or sine table of SHARC 102 back to the values which caused the minimum output of envelope detector 85. If the maximum amplitude of the sinusoidal output of DAC 33 is reached, microprocessor 57 begins to change the DC offset of the sinusoidal output of DAC 35 by changing in the negative direction the sinusoidal amplitudes in the Q channel table in the RAM of SHARC 102. Microprocessor 57 continuously decreases the sine amplitudes until it senses a minimum change or an increase in the output of envelope detector 85.

These approximately 0.1% fixed step changes in mixer offsets could create mixer DC offset errors as high as 0.05%, which would correspond to a carrier feedthrough component as high as −66 dB. The carrier feedthrough component is preferably nulled to a greater extent better than −66 dB (at least −70 dB and preferably −80 dB). To do this, the program initially adjusts the DC offset in relatively coarse steps of 0.1% or more until no further improvement can be obtained. Then, the program reduces the step size to approximately 0.01% and repeats the above described nulling procedure. Similarly, when adjustments are made for phase, gain and delay, plural different adjustment step sizes are provided. The use of different step sizes increases the speed of adjustment. Also, when the mixer system is far out of adjustment, making small adjustments to offset, gain, etc. may not make a detectable change in the unwanted beat note amplitude. Hence, in certain instances, the initial adjustment step is preferably coarser than 0.1% and several step changes of different sizes, e.g., 1%, 0.1% and 0.01% are made in the adjustment process. The large 1% initial step change provides a greater likelihood of being able to detect changes.

If the output of envelope detector 85 increases as a result of the initial positive going incremental change in the offset applied by microprocessor 57 to the I channel representing outputs of processor 23, memory 92 is programmed to change in the negative direction the offsets supplied by microprocessor 57 to processor 23 for the I channel output of DAC 33. Operation for negative going offsets is the same, but in the opposite direction, as described for the positive offsets.

After the appropriate I channel offset has been developed during operation 504, memory 92 is programmed to cause microprocessor 57 to execute operation 506. During operation 506 microprocessor 57 is programmed to adjust the output signals of processor 23 so the Q channel digital signals supplied to DAC 35 are provided with an offset that minimizes the output of envelope detector 85. Control of the Q channel offset output of DAC 35 is performed during operation 506 in the same manner that the I channel output is minimized during operation 504. The I channel and Q channel offsets determined during operations 504 and 506 are supplied by microprocessor 57 to memory 92, where they are stored for possible future use. These offset values cause $(P_1+D_1)$ and $(P_2+D_2)$ (Equation 2) to be reduced towards zero. The amplitude values in the sine and cosine tables in SHARC 102 reflect the offset values, as described supra.

After microprocessor 57 determines the appropriate DC offset for the Q channel output of DAC 35, memory 92 is programmed to execute operation 508, during which microprocessor 57 causes processor 23 to supply DACs 33 and 35 with digital signals representing 500 Hz cosine and sine waves. While DACs 33 and 35 derive the I and Q channel 500 Hz outputs, the center frequency of bandpass filter 81 remains at 1 kHz. Thereby, filter 81 passes a signal representing variations in the FM output wave of filter 71 at the frequency $(f_c+f_a)$ and the amplitude of the output signal of detector 85 provides a measure of $$\frac{B_1 C_1}{2} - \frac{B_2 C_2}{2},$$

Equation 2. By minimizing the value of $$\frac{B_1 C_1}{2} - \frac{B_2 C_2}{2},$$

the unwanted components at $f_c$ and $f_a$ in Equation 2 are reduced.

Then, during operation 510, microprocessor 57 responds to the output of envelope detector 85 and supplies memory 92 with a signal indicative of the amplitude of the envelope detector output. If the output of envelope detector 85 has a zero value at this time, memory 92 is programmed so microprocessor 57 takes no further action. However, if there are variations in the output of envelope detector 85, memory 92 is programmed to cause microprocessor 57 to change the peak to peak amplitude of the I channel sinusoidal wave derived by DAC 33. If operation 510 indicates the output of envelope detector 85 has a finite, non-zero value, memory 92 causes microprocessor 57 to initially increase the peak to peak amplitude of the I channel representing digital signal processor 23 supplies to DAC 33 via converter 29. This result is achieved by loading SHARC 102 with cosine values of the same phase but multiplied by a scaling value slightly greater than one. These values are computed by microprocessor 57 and loaded into the RAM in SHARC 102. Similarly, the slope values are scaled by the same amount and are loaded into SHARC 102. Microprocessor 57 makes these changes by multiplying the theoretical sine/cosine values at each of the 1024 phase positions by a constant.

After the peak to peak sinusoidal output of DAC 33 has been changed by an initial incremental value, memory 92 is programmed to cause microprocessor 57 again to compare the output of envelope detector 85 with the previous output of the envelope detector. In response to a decrease in the output of envelope detector 85 as a result of an increase in the peak to peak amplitude of the I channel output of DAC 33, memory 92 is programmed to activate microprocessor 57 to cause the output of processor 23 to cause a further increase in the peak to peak amplitude of the output of DAC 33. Microprocessor 57 continues to increase the peak to peak amplitude represented by the digital outputs of processor 23 for the I channel until a maximum peak amplitude of DAC 33 is reached or the output of envelope detector 85 increases. If the maximum peak amplitude of DAC 33 is reached, microprocessor 57 incrementally decreases the peak to peak amplitude of the sine wave supplied to DAC 33 by changing the amplitude and slope tables in the RAM of SHARC 102. When microprocessor 85 detects no change or an increase in the output of envelope detector 85, the microprocessor supplies processor 23 with a signal that appropriately sets the peak to peak amplitude of the I channel amplitude derived by DAC 33.

If the output of envelope detector 85 increases as a result of the initial increase in the amplitude of the output of DAC 33, the peak to peak output of DAC 33 is returned to the initial value thereof and memory 92 is programmed to control microprocessor 57 to decrease the peak to peak amplitude of the I channel sinusoidal wave derived by DAC 35. The peak to peak value of the I channel sinusoidal wave derived by DAC 33 is sequentially decreased in this manner until microprocessor 57 detects no change or an increase in the output of envelope detector 85. In this manner, the relative value, i.e. ratio, of the peak to peak values of the I and Q sinusoidal waves derived by DACs 33 and 35 is controlled to minimize the output of envelope detector 85.

Memory 92 is programmed to cause microprocessor 57 to now advance to operation 512, during which the phase of the Q channel output of DAC 35 is adjusted until the output of envelope detector 85 is minimized. Memory 92 continues to supply microprocessor 57 with a signal which causes processor 23 to supply DACs 33 and 35 with digital signals which cause the DACs to derive 500 Hz sinusoidal waves. The 500 Hz sinusoidal waves derived from DACs 33 and 35 have DC levels determined by the offsets established during operations 504 and 506 and a ratio of peak to peak values established during operation 510. The center frequency of filter 81 remains at 1 kHz. While memory 92 is controlling microprocessor 57 so processor 23 causes DACs 33 and 35 to derive such 500 Hz sinusoidal waves, the phase of the Q channel sinusoid derived by DAC 35 is adjusted during operation 512 until the output of envelope detector 85 is minimized whereby the value of $\phi_1+\phi_2-\theta_1$, Equation 2, is reduced.

To accomplish such a result, memory 92 controls microprocessor 57 so the Q channel representing digital signals stored in the sine amplitude and slope tables in the RAM of SHARC 102 are shifted between immediately adjacent phase positions. This causes the Q channel signals derived by processor 23 to be shifted by successive phases relative to the I channel signals. Initially, microprocessor 57 activates processor 23 so the Q channel outputs of processor 23 are shifted so there is a phase shift thereof toward the phase of the I channel outputs of the processor. Each time processor 23 shifts the outputs of the Q channel signals to effect a phase change, microprocessor 57 determines if the output of envelope detector 85 has changed. Each time microprocessor 57 detects a decrease in the successive outputs of envelope detector 85, it again phase shifts the Q channel representing outputs of processor 23. However, when microprocessor 57 detects an increase or no change in the output of envelope detector 85, memory 92 controls the microprocessor to shift the phase displacement of the Q channel output of processor 23 back one step. If microprocessor 57 and memory 92 detect that the initial change in the Q channel output of processor 23 toward the I channel phase results in an increase in the output of envelope detector 85, memory 92 is programmed to control microprocessor 57 so the Q channel output of processor 23 causes the phase of the Q channel output of DAC 35 to be displaced away from the I channel output of DAC 33.

After operation 512 has been completed and the Q channel phase which resulted in the minimum output of phase detector 85 has been stored in memory 92 and the amplitude and slope Q channel tables in the RAM of SHARC 102 have been loaded, the program of microprocessor 57, as stored in memory 92, is advanced to operation 514. During operation 514, memory 92 supplies microprocessor 57 with a signal which causes processor 23 to derive output signals which result in DACs 33 and 35 deriving 100 kHz baseband sinusoidal waves. The 100 khz waves derived by DACs 33 and 35 have the DC offsets determined by operations 504 and 506, the relative peak to peak amplitudes determined by operation 510, and the phase position determined by operation 512. With DACs 33 and 35 deriving such sinusoidal waves, memory 92 is programmed to activate microprocessor 57 so the center frequency of filter 81 is 200 kHz, a result achieved by connecting a 200 kHz center frequency bandpass filter into the network and disconnecting the 1 kHz center frequency filter that is in network during operations 504–512. With the 200 kHz center frequency filter 81 in the network and DACs 33 and 35 deriving 100 kHz sinusoids, detector 85 provides an output having a frequency of $(f_c-2f_a)$. By making an adjustment to minimize the output of detector 85, the value of $\phi_1+\phi_2-\theta_1$ (Equation 2) approaches zero.

These 100 kHz sinusoidal waves derived by DACs 33 and 35 are applied to variable time delay allpass filters 49 and 51 via lowpass filters 41 and 43, respectively. During operation 516, memory 92 controls microprocessor 57 so the time delays introduced by filters 49 and 51 on the sinusoidal output waves of lowpass filters 41 and 43 are controlled to minimize the output of envelope detector 85. DACs 33 and 35 derive a signal toward the high end of the range of frequencies that represent the instantaneous broadcast information and which is quite different from the 1 kHz and 500 Hz waves derived by the DACs during operations 504–512 because filters 41 and 43, as well as mixers 59 and 61, act on the DAC outputs in different ways at opposite ends of the frequency range for the DAC outputs. To minimize the output of detector 85 while DACs 33 and 35 are deriving the 100 kHz sinusoidal waves, memory 92 controls microprocessor 57 so the delay time introduced by filter 49 on the output of filter 41 is initially increased by successive increments. After each increase in the delay time introduced by filter 49, microprocessor 57 determines the output of envelope detector 85 and compares it with the output of the envelope detector for the immediately previous delay time setting of filter 49. Microprocessor 57 successively increases the delay time of filter 49 until the microprocessor senses an increase in the output of envelope detector 85 relative to the output of the envelope detector for the immediately preceding delay time setting of filter 49. When microprocessor 57 detects an increase in the output of envelope detector 85, it activates memory 92 which then controls microprocessor 57 to set the delay time of filter 49 back to the delay time which caused the output of envelope detector 85 to be minimized.

If the initial increase in the delay time of filter 49 resulted in an increase in the output of envelope detector 85, memory 92 is programmed to cause microprocessor 57 to decrease the delay time of filter 49. If microprocessor 57 senses that either the upper or lower delay time limit of filter 49 is reached, the microprocessor begins to control the delay time of filter 51 in a direction opposite from the most recent change in delay time of filter 49. The delay time of filter 51 is accordingly successively incremented until the minimum output of envelope detector 85 is sensed by microprocessor 57 and memory 92.

After operation 516 has been completed, memory 92 is programmed to control microprocessor 57 to make a determination as to whether just completed operations 502–516 resulted in the output of envelope detector 85 decreasing relative to the output of the envelope detector prior to operation 502 being performed. If the immediately preceding operations 502–516 did not cause a reduction in the output of envelope detector 85, microprocessor 57 writes into the RAM of SHARC 102 signals it reads from memory 92 indicative of the previous values of: (1) DC offsets for the I and Q sinusoids, (2) peak to peak amplitudes of the I and Q channel sinusoids, (3) the phase angle of the Q channel and (4) the delay times of filters 49 and 51. If, however, microprocessor 57 now senses a decrease in the output of envelope detector 85, operations 502–516 are repeated. Operation continues in this way until microprocessor 57 senses that there is no decrease in the output of envelope detector 85 after operation 516 has been completed, relative to the output of the envelope detector which subsisted prior to the immediately preceding sequence of operations 502–516.

To these ends, each time operation 516 is completed, microprocessor 57 loads memory 92 with a signal indicative of the output of envelope detector 85 which was extant at the completion of operation 516. Microprocessor 57 then, during operation 518, determines if the value determined during operation 516 differs from the output envelope detector 85 derived immediately preceding the most recent operation 502. If this is the initial iteration of operations 502–516, the output of envelope detector 85 is compared with a predetermined, relatively high value stored in memory 92, whereby there is certain to be a decrease in the output of the envelope detector relative to this predetermined value. Thereby, a second sequence of operations 502–516 is initially assured.

In response to operation 518 indicating there has been no change in the output of envelope detector 85, memory 92 is programmed to cause microprocessor 57 to advance to operation 520, during which all parameters which were changed as a result of just completed operations 502–516 are deleted and there is a restoration of the previous parameters representing DC offset for the I and Q channels, the peak to peak amplitudes of the I and Q channels, the phase of the Q channel and the relative delay times of filters 49 and 51.

If microprocessor 57 determines during operation 518 that there was a change in the output of envelope detector 85, memory 92 is programmed to advance microprocessor 57 to operation 522. During operation 522, microprocessor 57 determines if the output signal of envelope detector 85 is greater or less than the output of the envelope detector immediately prior to the most recently completed operation 502. In response to operation 522 indicating the output of envelope detector 85 was greater, microprocessor 57 and memory 92 are activated so operation 520 is repeated, whereby the prior values of offset, peak to peak amplitude, phase adjustment and phase delay are restored. If, however, microprocessor 57 determines during operation 522 that the output of envelope detector 85 was less after the completion of operation 516 relative to the output of the envelope detector prior to the most recently completed operation 502, memory 92 is activated to cause microprocessor 57 to again execute operation 502. Then operations 504–518 are repeated in sequence and operation 522 is selectively performed. In response to operation 518 or 522 causing operation 520 to be executed, memory 92 controls microprocessor 57 to terminate the calibration operation for section 42. Switch 89 is then activated so the output of envelope detector 87 is supplied to analog to digital converter 91. Then or at some subsequent time, the sequence of operations is repeated for section 44. The subsequent time is determined by a timer or by an operator or by microprocessor 57 sensing an output of converter 91 that is significant enough to indicate a change in the amplitude of the envelope derived by bandpass filter 73. The time between adjustments can also be a function of internal temperature change. To this end, a temperature sensor (not shown) is located inside the equipment of FIG. 1. The temperature sensor supplies a signal directly proportional to temperature to microprocessor 57 which responds to predetermined changes in the signal value to initiate mixer recalibration operations.

After the calibration operations of FIG. 6 have been completed, the tables of the RAM in SHARC 102 store digital signals representing the amplitude and slope at the 2048 phase positions of a single cycle of a sine wave and at the 2048 positions of a cosine wave. These signals enable DACs 33 and 35 to derive baseband sinusoidal waves such that $P_1 \neq P_2 \neq 0$ and $(\phi_1 + \phi_2 = \theta_1) \neq 0$ so the transmitter derives a frequency modulated wave having a frequency $(f_c - f_a)$ and very low amplitudes at $f_c$ and $(f_c + f_a)$. In addition filters 49 and 51 have delay times which further reduce the amplitudes at $f_c$ and $(f_c + f_a)$. Thereby, the frequency modulated carrier derived from bandpass filter 71 is such as to obviate the problems associated with mismatches in filters 41 and 43, mixers 59 and 61 and the leads and other circuitry associated therewith, that tend to create in-band spurious images at $f_c$ and $(f_c + f_a)$; in addition, the signals stored in the RAM sine and cosine tables of memory 92 enable offsets in mixers 59 and 61 which create a carrier feedthrough component at $f_c$ to be virtually eliminated.

From the foregoing, the transmitter of FIG. 1 is calibrated only while section 42 or 44 is decoupled from power amplifier 103 by opening switches 93 and 95, respectively. While this approach is desirable from a stability standpoint, it has certain disadvantages relating to the need for two parallel analog processing sections, each requiring separate calibration, leading to considerable added expense and the likelihood of the two sections having differing characteristics.

To overcome these deficiencies, several embodiments have been developed enabling calibration to be performed online, i.e., while one of broadcast sources 11–16 is supplying signals to a single one of sections 42 and 44. In these embodiments, only one of sections 42 and 44 is used, to obviate the need for the other section and for switches 89, 93 and 95. To these ends, detection circuit 75, as illustrated in FIG. 1, is replaced with the detection circuitry described in connection with FIGS. 7–13 which detect changes in the transmitted f.m. envelope amplitude while the same signal which drives the detection circuitry drives the substantial load comprised of power amplifier 103. Slope modulation of the envelope must be minimized in the arrangements of FIGS. 7–13. Each of the parameters described in connection with the online calibration techniques is iteratively adjusted by microprocessor 57 until envelope modulation is a minimum. In each of these online calibration arrangements, averaging the responses for a substantial time period in microprocessor 57 is necessary to mitigate the effects of slope detection, changing program characteristics and program pauses, i.e., silent intervals in the programming.

In the following discussion of the calibration techniques and apparatus of FIGS. 7–13, the output of section 42, from summer 68, is supplied to the calibration arrangement via a 3 db power divider (not shown), having first and second outputs for respectively driving bandpass filter 71 and the calibration arrangement. The output of bandpass filter 71 is applied directly to limiter 99, which can drive power amplifier 103 directly or via bandpass filter 101. Hence, summer 97 is eliminated and in some instances bandpass filter 101 is eliminated.

Figure 7:
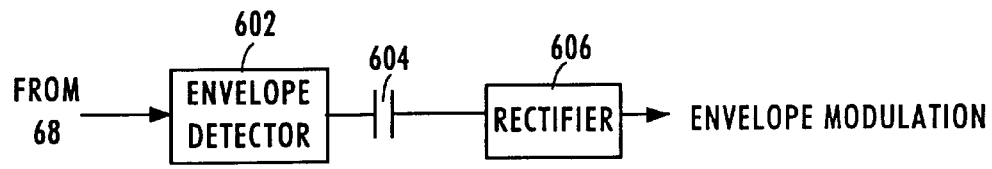
FIG. 7 is a block diagram of a first alternate arrangement for enabling the transmitter of FIG. 1 to be calibrated during a broadcast program.

In the calibration embodiment of FIG. 7, the amount of envelope modulation is measured during broadcast conditions of one of sources 11–17 by applying the output signal of summer 68 to envelope detector 602. Envelope detector 602 derives a DC signal having an amplitude directly proportional to the peak amplitude of the output of summer 68. The output of envelope detector 602 is AC coupled by series capacitor 604 to rectifier 606, which includes a low pass filter so the rectifier is constructed similar to an AM radio receiver detector. However, rectifier 606 responds to changes in amplitude of the envelope derived by summer 68. The output signal of rectifier 606 is supplied to microprocessor 57 via analog to digital converter 91. Microprocessor 57 detects the amplitude of the output of rectifier 606 exceeding a predetermined, relatively low value, associated with amplitude modulation of the envelope of the output of summer 68.

In response to the output of rectifier 606 exceeding the predetermined value, microprocessor 57 initiates a calibration routine. The calibration routine is similar to that described in connection with FIG. 6, in that DC offset of the sine and cosine values stored in the RAM of SHARC 23 are initially changed, followed by changes in the peak to peak amplitude of the sine and cosine values in the RAM, followed by changes in the phase angle of the sine wave stored in the RAM relative to the cosine wave stored in the RAM, in turn followed by adjustment of the delay times of filters 49 and 51. After each incremental change has been made, microprocessor 57 compares the voltage amplitude output of rectifier 606 with the rectifier output voltage amplitude prior to the change. If there is a decrease in the output of rectifier 606, the change is retained and another change in the same direction is then made. The process continues until there is an increase in the output of rectifier 606 or the output of the rectifier remains the same. When there is an increase in the output of rectifier 606 or the output of the rectifier remains the same, the changes which have been made in the RAM of processor 23 or in filter 49 or 51 are discarded and the prior value in the RAM or of the filter is restored.

Figure 8:
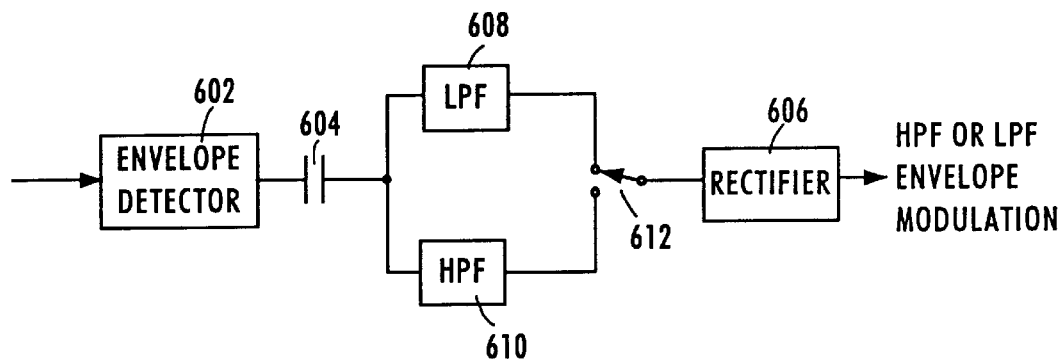
FIG. 8 is a block diagram of a second embodiment which enables the transmitter of FIG. 1 to be calibrated during a broadcast program, wherein low pass and high pass filters are selectively connected in circuit to reduce calibration time and provide increased adjustment accuracy, relative to the apparatus disclosed in FIG. 7.

In the embodiment of FIG. 8, lowpass filter 608 and highpass filter 610 are driven in parallel by the AC signal coupled through capacitor 604 and one of the filters is selectively connected by switch 612 (under the control of microprocessor 57) to the input of rectifier 606. Filter 608 has a cutoff frequency in the range of 1 kHz–10 kHz while filter 610 has a cutoff frequency in the range of 30 kHz to 100 kHz. While lowpass filter 608 is connected to rectifier 606, the DC offsets of the sine and cosine values in the RAM of processor 23 are iteratively changed, as are the amplitude values of the sine and cosine waves and the relative phases of the sine and cosine waves. While switch 612 connects the output of highpass filter 610 to rectifier 606, the delay times of filters 49 and 51 are iteratively changed. The iterative changes are on the same basis as discussed in connection with FIG. 7, i.e., the iterative change is retained only if the output of rectifier 606 is less as a result of the change than it was prior to the change. The frequency discriminating highpass and lowpass arrangement of FIG. 8 shortens the time required for microprocessor 57 to make the iterative adjustments and increases adjustment accuracy compared to the circuitry of FIG. 7.

Figure 9:
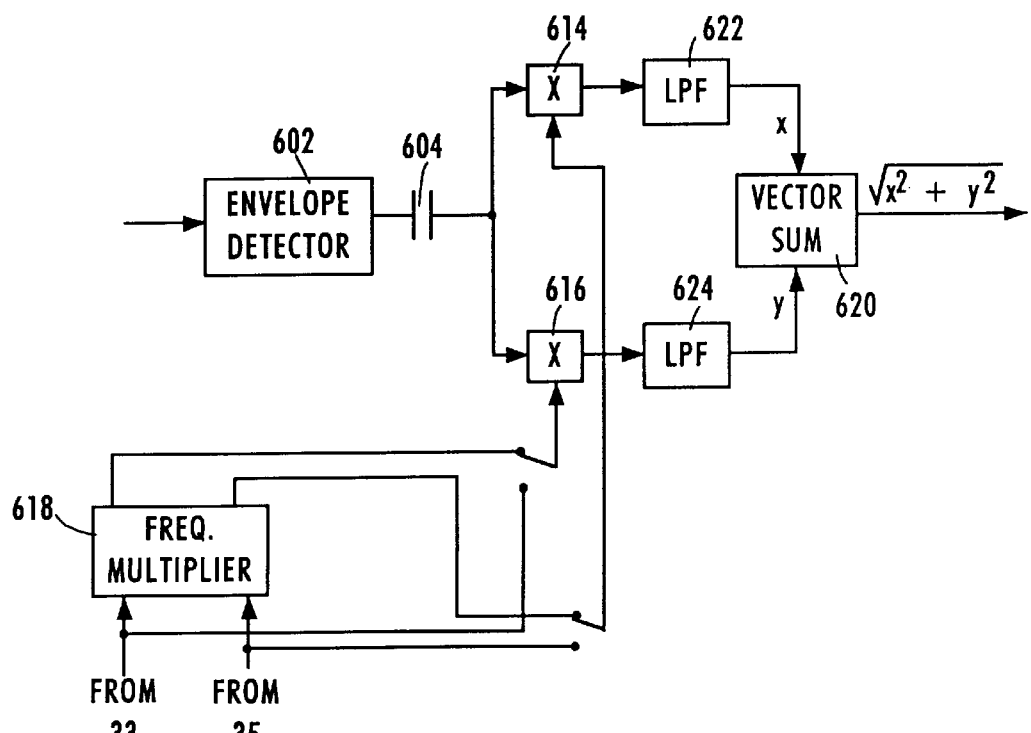
FIG. 9 is a block diagram of a further embodiment of the invention which enables the transmitter of FIG. 1, in modified form, to be calibrated during a broadcast program, wherein feed through beat note and/or in-band image beat notes are detected.
Figure 13:
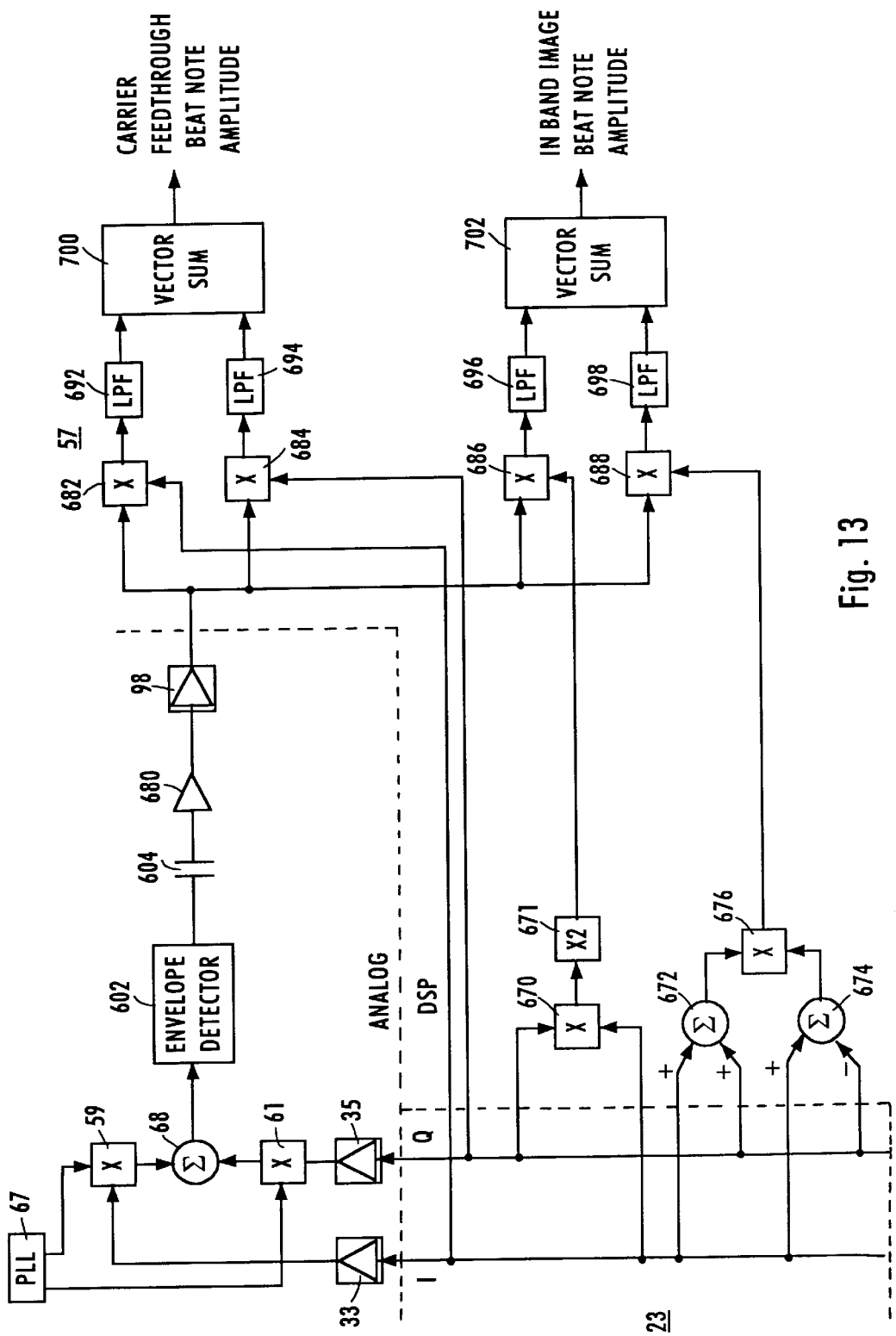
FIG. 13 is a block diagram of analog calibrating circuitry in combination with calibrating operations performed in a microprocessor included in the transmitter of FIG. 1.

In the embodiments of FIGS. 9 and 13, microprocessor 57 monitors changes in the amplitude of the envelope derived by summer 68 at the deviation frequency and at twice the deviation frequency of the broadcast signal. If microprocessor detects a change of the envelope amplitude derived by summer 68 at the deviation frequency, the microprocessor makes iterative adjustments to the offsets of the sine and cosine values stored in the RAM of processor 23 until the change is minimized. In response to changes of the envelope amplitude at twice the deviation frequency, microprocessor 57 iteratively changes the peak to peak amplitude and phase angle of the sine and cosine values in the RAM and the delay times of filters 49 and 51. The arrangements of FIGS. 9 and 13 have the advantage over the arrangements of FIGS. 7 and 8 that they reject the slope detection components of the envelope. However, the arrangement of FIG. 9 employs considerably more hardware than the arrangements of FIGS. 7 and 8. However, the analog hardware components arrangement of FIG. 9 can be mimicked by operations in microprocessor 57.

Figure 10:
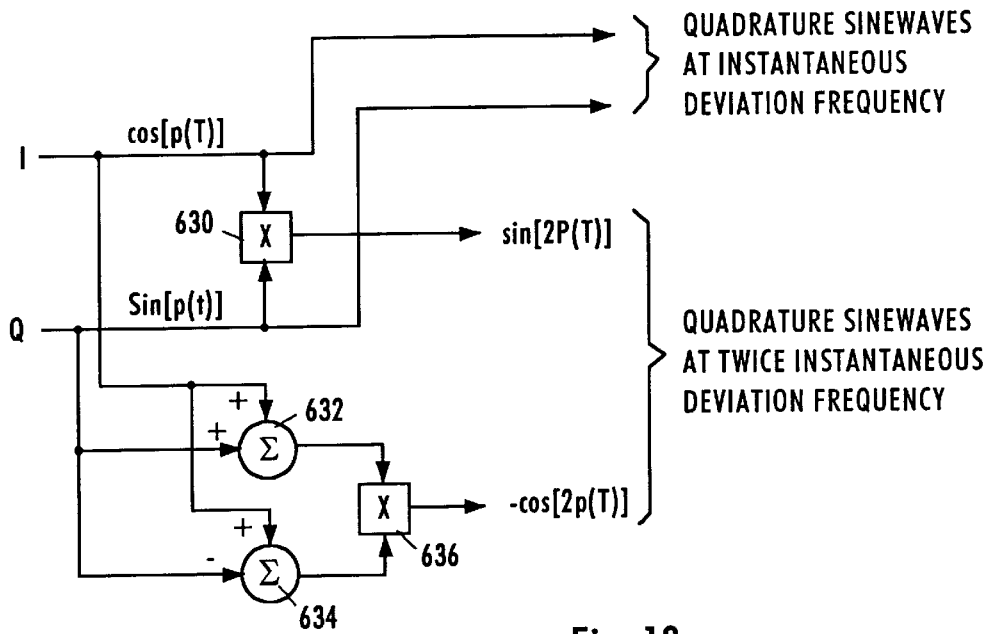
FIG. 10 is a block diagram of apparatus that can be used in the embodiment of FIG. 9 to provide times two frequency multiplication of the instantaneous deviation frequency derived by the apparatus of FIG. 1, while preserving the phase relation of the deviation frequency.
Figure 11:
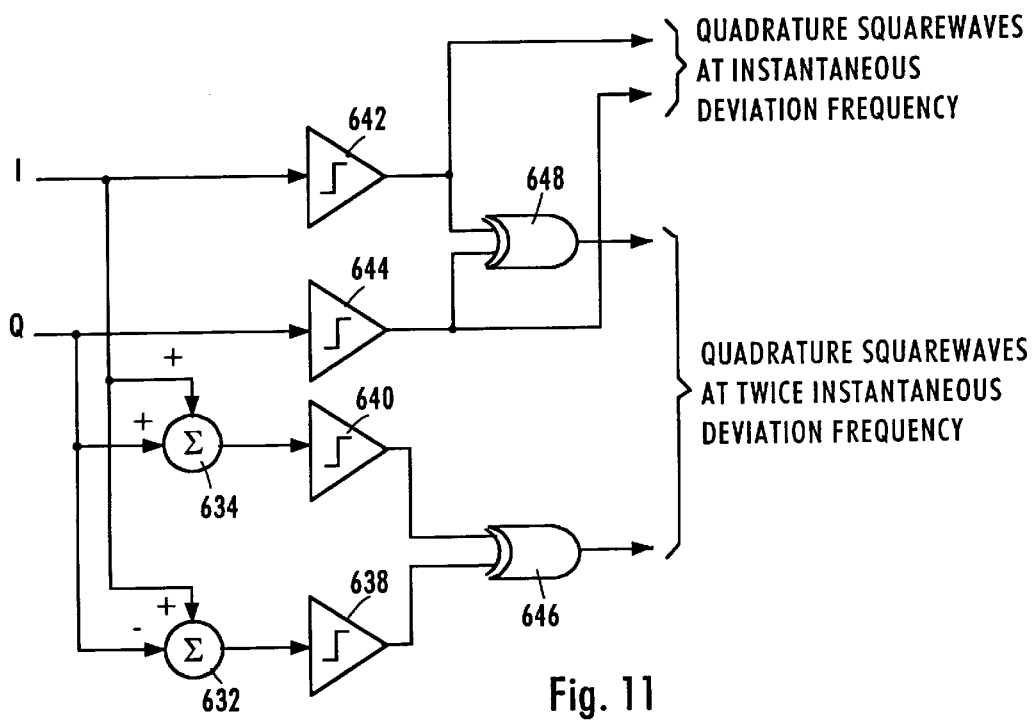
FIG. 11 is a modification of the apparatus illustrated in FIG. 10, wherein quadrature square waves at the instantaneous deviation frequency and at twice the instantaneous deviation frequency are derived.

In the arrangement of FIG. 9, the AC signal coupled through capacitor 64 is applied in parallel to one input of both of four quadrant analog multipliers 614 and 616, each having a second input respectively responsive to the constant amplitude AC signals derived from DACs 33 and 35 or to constant amplitude AC orthogonal signals having a frequency twice that of the DACs. The frequency derived by DACs 33 and 35 is multiplied by a factor of two in processor 618, two embodiments of which are illustrated in FIGS. 10 and 11. The second inputs of multipliers 614 and 616 are directly responsive to the $\cos\omega_{at}$ and $\sin\omega_{at}$ outputs of DACs 33 and 35 about half the time and are responsive to $\cos 2\omega_{at}$ and $\sin 2\omega_{at}$ outputs of processor 618 during about half of the remaining time. To these ends, the outputs of DACs 33 and 35 and processor 618 are selectively coupled at different times through double pole-single throw switches 619 and 620 (controlled by microprocessor 57) to multipliers 614 and 616, respectively.

The resulting low frequency sidebands derived from multipliers 614 and 616 are respectively derived from lowpass filters 622 and 624. The vector sum of the output signals of lowpass filters 622 and 624 is derived by vector summer 626 which derives an AC analog output having an instantaneous amplitude directly proportional to $\sqrt{X^2+Y^2}$, where X and Y are respectively proportional to the instantaneous amplitudes of output signals of filters 622 and 624. The instantaneous amplitude of the output signal of vector summing circuit 626 is thereby indicative of the instantaneous frequency of the carrier feed through beat note (i.e. $(f_o-f_c)$) or the in-band image beat note (i.e. $(f_o+f_c)$). While vector summer 626 is shown as an analog circuit, it is to be understood that the vector summing operation can and is preferably performed by microprocessor 57, by supplying the outputs of filters 622 and 624 to an analog to digital converter arrangement (not shown) which drives the microprocessor.

A preferred embodiment of processor 618 which responds to the $\cos\omega_{at}$ and since, outputs of DACs 33 and 35 to derive the $\cos 2\omega_{at}$ and $\sin 2\omega_{at}$ signals is illustrated in FIG. 10. The $\cos 2\omega_{at}$ and $\sin 2\omega_{at}$ signals are derived on the basis of the trigonometric identities $2\sin\omega_{at}\cos\omega_{at}=\sin 2\omega_{at}$ and $(\cos^2\omega_{at}-\sin^2\omega_{at})=(\cos\omega_{at}+\sin\omega_{at})(\cos\omega_{at}-\sin\omega_{at})=\cos 2\omega_{at}$.

To these ends, the processor 618 illustrated in FIG. 10 includes analog four quadrant multiplier 630, having a fixed factor of two, as well as first and second input terminals respectively responsive to the I and Q output signals of DACs 33 and 35. Multiplier 630 responds to the nominally orthogonally phased input signals thereof to derive an output signal having a frequency equal to twice the common frequency of the output signals of DACs 33 and 35, in accordance with the function $\sin 2\omega_{at}$, where $\omega_{at}$ is the common frequency derived by the DACs. The output signal of multiplier 630 is selectively applied via switch 620 to multiplier 616.

To derive the $\cos 2\omega_{at}$ component, the I and Q outputs of DACs 33 and 35 are supplied to analog summing circuits 632 and 634, such that summer 632 derives an AC analog output signal having an instantaneous amplitude directly proportional to I+Q, while summer 634 derives an output signal directly proportional to I−Q, where I is the $\cos\omega_{at}$ output of DAC 33 and Q is the $\sin\omega_{at}$ output of DAC 35. The resulting (I+Q) and (I−Q) output signals of summers 632 and 634 are combined in analog four quadrant multiplier 636, which derives a product output signal having an amplitude directly proportional to $-\cos 2\omega_{at}$. Hence, multipliers 630 and 636 derive orthogonally phased sinusoidal voltages at twice the deviation frequency caused by the selected one of sources 11–17.

A problem with the apparatus illustrated in FIG. 10 is that four quadrant analog multipliers 630 and 636 are required. These analog multipliers drive four quadrant analog multipliers 614 and 616, FIG. 9. Four quadrant analog multipliers are expensive, complicated and subject to offsets and other inaccuracies. It is, therefore, desirable, if possible, to eliminate four quadrant analog multipliers 614, 616, 630 and 636.

It is possible to simplify the circuitry to eliminate multipliers 614, 616, 630 and 636 by converting the analog input signals to the multipliers to square waves by using an analog comparator at the inputs of the multipliers and by replacing the multipliers with switching modulators. The analog comparators derive bi-level signals having binary 1 and 0 values in response to the input signals thereof exceeding and being less than threshold values, respectively. If such square waves are employed in the calibration circuitry of FIG. 9 in combination with FIG. 10, the beat derived from vector summer 626 has some response at odd harmonics of its intended frequency. However, there will not normally he any significant energy in the odd harmonics, making the results similar to the result attained through the use of analog multipliers.

FIG. 11 is a circuit diagram of a specific configuration of digital circuitry for deriving quadrature phased square waves at the instantaneous deviation frequency of the waves derived by DACs 33 and 35 and for deriving quadrature square waves at twice the instantaneous deviation frequency derived by the DACs. As illustrated in FIG. 11, the I and Q analog output signals of DACs 33 and 35 are combined in analog summers 632 and 634, having (I+Q) and (I−Q) analog output signals that are respectively supplied to comparators 638 and 640. The I and Q input signals are also respectively supplied to comparators 642 and 644. The resulting bi-level output signals of comparators 638 and 640 are supplied to exclusive OR gate 646, while the bi-level outputs of comparators 642 and 644 are supplied to exclusive OR gate 648. Exclusive OR gates 646 and 648 are effectively four quadrant binary multipliers which derive square waves that are approximately 90° phase displaced from each other at twice the instantaneous carrier deviation frequency derived by DACs 33 and 35. Quadrature square waves at the instantaneous deviation frequency derived by DACs 33 and 35 are derived at the output terminals of comparators 642 and 644.

Figure 12:
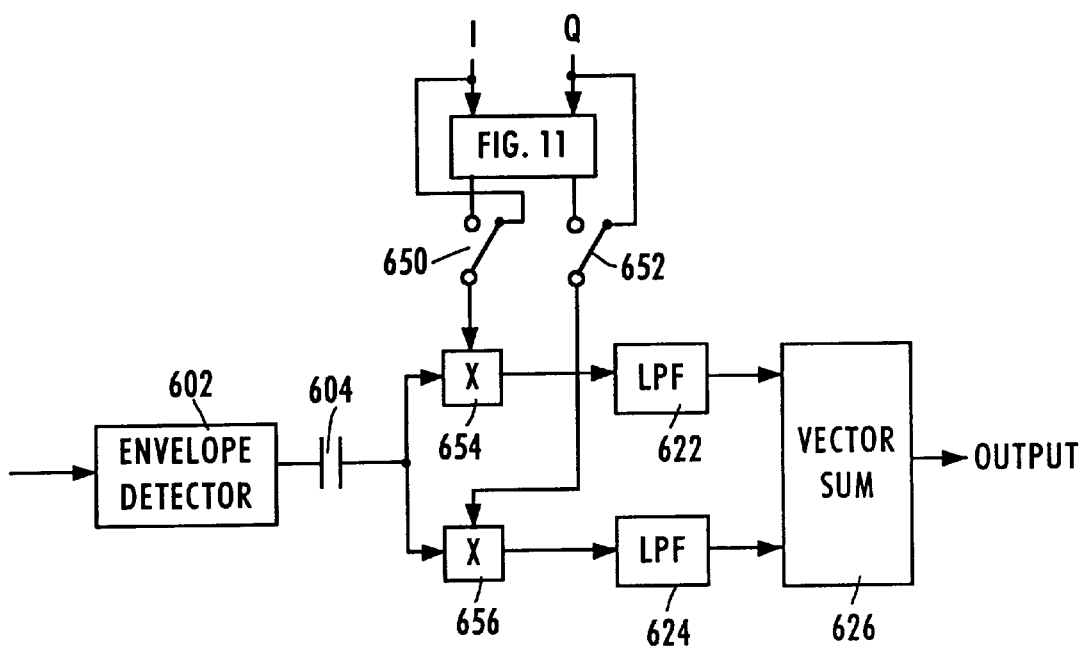
FIG. 12 is a block diagram of a further calibration apparatus wherein the analog multipliers of FIG. 9 are replaced by switching modulators.

The two sets of quadrature square waves, at the instantaneous deviation frequency and at twice the instantaneous deviation frequency, derived by the circuitry of FIG. 11, are selectively supplied via single pole-double throw switches 650 and 652 to switching modulators 654 and 656, FIG. 12, so that during a first interval the square waves at the instantaneous deviation frequency are supplied to the modulators and during alternate second intervals the square waves at twice the instantaneous deviation frequency are supplied to the modulators. Switching modulators 654 and 656 are driven in parallel by the AC signal coupled through capacitor 604. Each of switching modulators 654 and 656 has a gain of +1 in response to the bi-level signal supplied to it by the square waves coupled through switches 650 and 652 having binary one values and a gain of −1 in response to the bi-level signal having a zero value. Thereby, the output signals of switching modulators 654 and 656 have the same values as the inputs thereof when the signals coupled through switches 650 and 652 have binary one values; the output signals of switching modulators 654 and 656 have the same amplitude, but are of opposite polarity as the input signals thereof in response to the signals coupled through switches 650 and 652 having binary zero values.

The output signals of switching modulators 654 and 656 are respectively applied to low pass filters 622 and 624, having outputs which drive vector sum circuitry 626. The output signal of the vector sum circuitry 626 is quite similar to the output signal of the vector sum circuitry in FIG. 9, although there may be a small amount of jitter with the system of FIG. 12 due to the finite sampling rate which occurs as a result of the square waves being supplied to switching modulators 654 and 656 and the switching process of these modulators.

The analog operations performed by the circuitry of FIG. 9 can, to a large extent, be performed by a digital processing system including SHARC processor 23 and microprocessor 57. A block diagram of operations performed to provide the equivalent operations in a digital processing system is illustrated in FIG. 13 wherein the I and Q digital components derived by SHARC 23 are supplied in parallel to DACs 33 and 35 and to microprocessor 57. Microprocessor 57 responds to the I and Q digital signals derived by SHARC processor 23 to derive digital signals representing the orthogonal I and Q components at twice the frequency at which the I and Q signals are derived in the SHARC processor.

To this end, microprocessor 57 includes multiplication operation 670, during which the I and Q signals derived in processor 23 are multiplied together to form a digital signal representing one-half the amplitude of the sine component at twice the deviation of frequency, i.e. ½sin2$\omega_{at}$; the sin$\omega_{at}$ signal is derived by multiplying the product derived during operation 670 by two during operation 671. A digital signal representing the cosine component at twice the deviation frequency, i.e., cos2$\omega_{at}$, is derived by adding and subtracting the I and Q digital signals derived by SHARC processor 23 during operations 672 and 674, respectively. The resulting sum and difference digital signal values derived during operations 672 and 674 are multiplied together during multiplication operation 676 to produce a digital signal having a value representing the cosine of twice the deviation frequency.

The digital I and Q signals derived by SHARC processor 23 are supplied, as in the embodiment of FIG. 1, to DACs 33 and 35 respectively. Output signals of DACs 33 and 35 are combined with orthogonal phases of the carrier frequency derived by phase locked loop 67 in mixers 59 and 61, having analog output signals that are summed together in summer 68. The output signal of summer 68 is applied to a power divider (not shown) which drives envelope detector 602 and power amplifier 101 in parallel, as described supra. Envelope detector 602 drives analog, AC amplifier 680 via AC coupling capacitor 604. The output signal of amplifier 680 is converted to a digital signal by analog-to-digital converter 91, having an output which is supplied to microprocessor 57.

During operations 670 and 676 microprocessor 57 responds to the output signal of analog-to-digital converter 91, as well as to the I and Q digital signals derived by SHARC processor 23 representing the orthogonal components at the deviation frequency and to the orthogonal components at twice the deviation frequency as derived by microprocessor 57. The output of analog to digital converter 91, representing changes in the amplitude of the envelope of the output of summer 68, is multiplied four different times during multiplication operations 682, 684, 686 and 688. During operations 682 and 684, the output signal of converter 91 is multiplied by the I and Q representing digital signals at the deviation frequency, as derived by processor 23. During operations 686 and 688, the output of converter 91 is multiplied by the digital sine and cosine components of twice the deviation frequency, as derived during operations 670 and 676, respectively. Digital product signals resulting from operations 682–688 are averaged in low pass filter operations 692, 694, 696 and 698 respectively. A digital signal representing the vector sum of the outputs resulting from operation 692 and 694 is formed during operation 700, to derive a digital signal representing the carrier feed through beat note amplitude. During operation 702, the vector sum of the signals resulting from low pass filter operations 696 and 698 is derived to provide a digital signal representing the inband image beat note amplitude. Microprocessor 57 responds to the output signals resulting from vector sum operations 700 and 702 to iteratively change the values of the cosine and sine values in the RAM of microprocessor 57, as well as the delay times of filters 49 and 51. These operations are performed in the same manner as discussed in connection with FIG. 6.

While there have been described and illustrated several embodiments of the invention, it will be clear that variations in the details of the embodiments specifically illustrated and described may be made without departing from the true spirit and scope of the invention as defined in the appended claims. For example, the DC blocking 15 kHz low pass filtering, peak limiting and pre-emphasis functions can be performed by analog circuitry which drives sources 15 and 17 or is included in sources 11 and 13. Such analog circuitry can also include an overshoot compensator circuit of a type well known in the art of processing analog signals for FM transmitter purposes.

We claim:

1. A radio transmitter for a signal representing speech and/or music broadcast information to be angle modulated on a carrier having a frequency at a carrier frequency for the transmitter comprising plural channels each responsive to a sinusoidal like wave having an angle determined by the amplitude of an analog signal associated with the speech and/or music broadcast information so that the frequency of the wave deviates from a reference value as the amplitude of the analog signal deviates from a reference value, each wave having (a) nominally the same maximum amplitude, and (b) a designed nominal phase difference, a plurality of mixers, each mixer being connected to be responsive to a different one of the sinusoidal like waves and to a different phase of the carrier, each of the mixers deriving a separate mixed output signal, the mixed output signals being linearly coupled together to derive an angle modulated output wave having a carrier at the carrier frequency, the carrier frequency being angle shifted to a deviation angle by the speech and/or music broadcast information, the channels, mixers, and circuitry associated with them having a tendency to introduce unwanted components in the output wave; at least one of the amplitude and phase of the sinusoidal like waves being such that at least one of the unwanted components is substantially not present in the output wave.

2. The transmitter of claim 1 wherein the sinusoidal like waves are at baseband.

3. The transmitter of claim 2 wherein the amplitude of the sinusoidal like waves is such that DC offset thereof as mixed in the mixers is substantially zero so a tendency for an unwanted component at the carrier frequency in the output wave is substantially removed.

4. The transmitter of claim 3 further including a calibrating arrangement for controlling the sinusoidal like waves to cause the DC offset thereof as mixed in the mixers to be substantially zero, the calibrating arrangement (a) causing the sinusoidal like waves to have a first frequency, (b) including a detector for envelope variations at the first frequency and (c) changing the DC offset of the sinusoidal like waves until the detector detects minimum envelope variations at the first frequency.

5. The transmitter of claim 2 wherein the output wave has a tendency to include unwanted components at the carrier frequency, the instantaneous relative amplitudes of the sinusoidal like waves as applied to the balanced mixers causing the unwanted components to be reduced substantially to zero.

6. The transmitter of claim 5 further including a calibrating arrangement for controlling the instantaneous relative amplitudes of the sinusoidal like waves.

7. The transmitter of claim 6 wherein the calibrating arrangement (a) causes the sinusoidal like waves to have a first frequency, (b) includes a detector for envelope variations at a second frequency equal to twice the first frequency and (c) changes the relative amplitudes, relative phases, and relative delays of the sinusoidal like waves until the detector detects minimum envelope variations at the second frequency.

8. The transmitter of claim 7 wherein the calibrating arrangement is arranged to sense changes in the amplitude of the envelope of an angle modulated signal containing the speech and/or music broadcast information transmitted by the transmitter.

9. The transmitter of claim 7 wherein the calibrating arrangement is arranged to sense changes in the amplitude of different frequency bands of the envelope of an angle modulated signal containing broadcast information transmitted by the transmitter.

10. The transmitter of claim 7 wherein the calibrating arrangement is arranged to (a) sense changes in a lowpass filtered amplitude of the envelope of an angle modulated signal containing the speech and/or music broadcast information transmitted by the transmitter, (b) change at least one of DC offset, relative peak-to-peak amplitude and relative phase angle of the sinusoidal like wave in response to the sensed changes in the lowpass filtered amplitude of the envelope of the angle modulated signal containing the speech and/or music broadcast information transmitted by the transmitter.

11. The transmitter of claim 7 wherein the calibrating arrangement is arranged to (a) sense changes in a lowpass filtered amplitude of the envelope of an angle modulated signal containing the speech and/or music broadcast information transmitted by the transmitter, (b) iteratively change at least one of DC offset, relative peak-to-peak amplitude and relative phase angle of the sinusoidal like wave until there are substantially no sensed changes in the lowpass filtered amplitude of the envelope of the angle modulated signal containing the speech and/or music broadcast information transmitted by the transmitter.

12. The transmitter of claim 7 wherein the calibrating arrangement is arranged to (a) sense changes in a lowpass filtered amplitude of the envelope of an angle modulated signal containing the speech and/or music broadcast information transmitted by the transmitter, (b) iteratively change DC offset, relative peak-to-peak amplitude and relative phase angle of the sinusoidal like wave until there are substantially no sensed changes in the lowpass filtered amplitude of the envelope of the angle modulated signal containing the speech and/or music broadcast information transmitted by the transmitter.

13. The transmitter of claim 12 wherein the calibrating arrangement is arranged to (a) sense changes in a highpass filtered amplitude of the envelope of an angle modulated signal containing the speech and/or music broadcast information transmitted by the transmitter, (b) change relative delay time of the sinusoidal like waves in response to the sensed changes in the highpass filtered amplitude of the envelope of the angle modulated signal containing the speech and/or music broadcast information transmitted by the transmitter.

14. The transmitter of claim 7 wherein the calibrating arrangement is arranged to (a) sense changes in a highpass filtered amplitude of the envelope of an angle modulated signal containing the speech and/or music broadcast information transmitted by the transmitter, (b) change relative delay time of the sinusoidal like waves in response to the sensed changes in the highpass filtered amplitude of the envelope of the angle modulated signal containing the speech and/or music broadcast information transmitted by the transmitter.

15. The transmitter of claim 7 wherein the angle modulation is frequency modulation causing the carrier frequency to be frequency shifted to a deviation frequency, and the calibrating arrangement is arranged to sense changes in the amplitude at a multiple of the deviation frequency of the envelope of the frequency modulated signal containing the speech and/or music broadcast information transmitted by the transmitter.

16. The transmitter of claim 15 wherein the multiple is one, the calibrating arrangement changing the DC offset in response to the sensed changes at the deviation frequency in the amplitude of the envelope of the frequency modulated signal containing the speech and/or music broadcast information transmitted by the transmitter.

17. The transmitter of claim 15 wherein the multiple is two, the calibrating arrangement changing the relative peak-to-peak amplitude and relative phase angle in response to the sensed changes at twice the deviation frequency in the amplitude of the envelope of the frequency modulated signal containing the speech and/or music broadcast information transmitted by the transmitter.

18. The transmitter of claim 17 wherein the calibrating arrangement derives the sensed changes at twice the deviation frequency by multiplying plural signals representing undulations at twice the deviation frequency with a signal representing changes in the envelope amplitude of the output wave, the phase relation of the modulations relative to the phase relation of the different sinusoidal like waves being preserved.

19. The transmitter of claim 18 wherein the calibration arrangement preserves the phase relation of the undulations relative to the phase relation of the different sinusoidal like waves by multiplying and adding the amplitudes of signals representing the amplitudes of the different sinusoidal like waves.

20. The transmitter of claim 15 wherein the multiple is one and two, the calibrating arrangement changing the DC offset in response to the sensed changes at the deviation frequency in the amplitude of the envelope of the frequency modulated signal containing the speech and/or music broadcast information transmitted by the transmitter, and changing the relative peak-to-peak amplitude and relative phase angle in response to the sensed changes at twice the deviation frequency in the amplitude of the envelope of the frequency modulated signal containing the speech and/or music broadcast information transmitted by the transmitter.

21. The transmitter of claim 6 wherein the calibrating arrangement includes an envelope detector responsive to an angle modulated signal containing the speech and/or music broadcast information of the transmitter.

22. The transmitter of claim 7 wherein the calibrating arrangement controls the sinusoidal like waves to cause the DC offset thereof as mixed in the mixers to be substantially zero, the calibrating arrangement (a) causing the sinusoidal like waves to have a frequency equal to the first frequency, (b) including a detector for envelope variations at a second frequency equal to twice the first frequency and (c) changes the relative amplitudes, relative phases, and relative delays of the sinusoidal like waves until the detector detects minimum envelope variations at the second frequency.

23. The radio transmitter of claim 1, wherein the broadcast information is modulated as a substantially constant amplitude envelope so each wave has nominally the same constant maximum amplitude and the output wave has a substantially constant amplitude envelope.

24. A method of operating an angle modulated radio transmitter responsive to a signal representing speech and/or music broadcast information and a carrier having a frequency at a carrier frequency for the transmitter comprising deriving plural analog sinusoidal like waves, each of the analog sinusoidal like waves nominally having (a) a substantially constant maximum amplitude that is approximately the same for all of the waves, (b) a baseband frequency that is the same at any instant of time and is determined by the speech and/or music broadcast information, and (c) a phase nominally displaced from the other waves by a predetermined angle, responding in analog processing circuitry to the analog sinusoidal like waves and the carrier to derive an angle modulated output wave having a carrier at the carrier frequency, the carrier frequency being angle modulated by the broadcast information; and controlling at least one of the amplitude and phase angle of the analog sinusoidal like waves to provide compensation for differential variations having a tendency to be imposed by the analog processing circuitry on the analog sinusoidal like waves and which tend to degrade the output wave.

25. The method of claim 24 wherein the differential variations include DC offset of analog baseband sinusoidal like waves which form the output wave, further including controlling values of the sinusoidal like wave amplitudes to minimize the DC offset.

26. The method of claim 25 wherein the controlling step is performed by calibrating the transmitter while it is transmitting the broadcast information and the analog processing circuitry is responsive to the broadcast information.

27. The method of claim 26 wherein the transmitter is calibrated by sensing changes in the amplitude of the envelope of an angle modulated signal containing speech and/or music broadcast information transmitted by the transmitter.

28. The method of claim 26 wherein the transmitter is calibrated by sensing changes in the amplitude of different frequency bands of the envelope of an angle modulated signal containing speech and/or music broadcast information transmitted by the transmitter.

29. The method of claim 26 wherein the transmitter is calibrated by (a) sensing changes in a lowpass filtered amplitude of the envelope of an angle modulated signal containing speech and/or music broadcast information transmitted by the transmitter, (b) changing at least one of DC offset, relative peak-to-peak amplitude and relative phase angle of the sinusoidal like wave in response to the sensed changes in the lowpass filtered amplitude of the envelope of the angle modulated signal containing broadcast information transmitted by the transmitter.

30. The method of claim 26 wherein the transmitter is calibrated by (a) sensing changes in a lowpass filtered amplitude of the envelope of an angle modulated signal containing speech and/or music broadcast information transmitted by the transmitter, (b) iteratively changing at least one of DC offset, relative peak-to-peak amplitude and relative phase angle of the sinusoidal like wave until there are substantially no sensed changes in the lowpass filtered amplitude of the envelope of the angle modulated signal containing speech and/or music broadcast information transmitted by the transmitter.

31. The method of claim 26 wherein the transmitter is calibrated by (a) sensing changes in a lowpass filtered amplitude of the envelope of an angle modulated signal containing speech and/or music broadcast information transmitted by the transmitter, (b) iteratively changing DC offset, relative peak-to-peak amplitude and relative phase angle of the sinusoidal like wave until there are substantially no sensed changes in the lowpass filtered amplitude of the envelope of the angle modulated signal containing broadcast information transmitted by the transmitter.

32. The method of claim 31 wherein the transmitter is calibrated by (a) sensing changes in a highpass filtered amplitude of the envelope of an angle modulated signal containing speech and/or music broadcast information transmitted by the transmitter, (b) changing relative delay time of the sinusoidal like waves in response to the sensed changes in the highpass filtered amplitude of the envelope of the angle modulated signal containing broadcast information transmitted by the transmitter.

33. The method of claim 26 wherein the transmitter is calibrated by (a) sensing changes in a highpass filtered amplitude of the envelope of an angle modulated signal containing speech and/or music broadcast information transmitted by the transmitter, (b) changing relative delay time of the sinusoidal like waves in response to the sensed changes in the highpass filtered amplitude of the envelope of the angle modulated signal containing broadcast information transmitted by the transmitter.

34. The method of claim 26 wherein the angle modulation is frequency modulation causing the carrier frequency to be frequency shifted to a deviation frequency, and the transmitter is calibrated by sensing changes in the amplitude of the frequency modulated wave at a multiple of the deviation frequency of the envelope of the frequency modulated signal containing speech and/or music broadcast information transmitted by the transmitter.

35. The method of claim 34 wherein the multiple is one, the calibration being performed by changing the DC offset in response to the sensed changes at the deviation frequency in the amplitude of the envelope of the frequency modulated signal containing speech and/or music broadcast information transmitted by the transmitter.

36. The method of claim 34 wherein the multiple is two, the calibration being performed by changing the relative peak-to-peak amplitude and relative phase angle in response to the sensed changes at twice the deviation frequency in the amplitude of the envelope of the frequency modulated signal containing speech and/or music broadcast information transmitted by the transmitter.

37. The method of claim 34, wherein there are two different multiples equal to one and two, the calibration being performed by changing the DC offset in response to the sensed changes at the deviation frequency in the amplitude of the envelope of the frequency modulated signal containing speech and/or music broadcast information transmitted by the transmitter, and by changing the relative peak-to-peak amplitude and relative phase angle in response to the sensed changes at twice the deviation frequency in the amplitude of the envelope of the frequency modulated signal containing speech and/or music broadcast information transmitted by the transmitter.

38. The method of claim 25 wherein DC offset of the sinusoidal like waves is minimized by causing each sinusoidal like wave to have a certain frequency, and then adjusting a DC offset of each sinusoidal like wave so amplitude variations at the certain frequency of an envelope of the output wave modulated by the certain frequency are minimized.

39. The method of claim 25 wherein the differential variations cause variations from a designed maximum value of the analog sinusoidal like waves, further including controlling the relative values of the sinusoidal like wave maximum amplitudes so the angle modulated output wave has a predetermined characteristic.

40. The method of claim 39 wherein DC offset of the sinusoidal like waves is minimized by causing each sinusoidal like wave to have a first frequency, then adjusting a DC offset of each sinusoidal like wave so amplitude variations at the first frequency of an envelope of the output wave modulated by the first frequency are minimized, and approximately equalizing the maximum amplitudes by causing each sinusoidal like wave to have a second frequency, and then adjusting the relative maximum amplitudes of the sinusoidal like waves until amplitude variations at twice the second frequency of an envelope of the output wave modulated by the second frequency are minimized.

41. The method of claim 40 wherein the sinusoidal like waves are derived from a digital to analog converter arrangement responsive to signals derived from a memory including tables of amplitudes vs. phase position values and slope vs. phase position values, and further including inserting into the tables the amplitude and slope values to enable the sinusoidal waves having the controlled offset and maximum amplitudes to be derived.

42. The method of claim 40 wherein the first frequency is twice the second frequency.

43. The method of claim 39 wherein the differential variations include variations from a designed phase difference of the analog sinusoidal like waves, further including controlling the relative instantaneous values of the sinusoidal like wave amplitudes so they have approximately the designed phase difference.

44. The method of claim 43 wherein DC offset of the sinusoidal like waves is minimized by causing each sinusoidal like wave to have a first frequency, then adjusting a DC offset of each sinusoidal like wave so amplitude variations at the first frequency of an envelope of the output wave modulated by the first frequency are minimized; approximately equalizing the maximum amplitudes by causing each sinusoidal like wave to have a second frequency, and then adjusting the relative maximum amplitudes of the sinusoidal like waves until amplitude variations at twice the second frequency of an envelope of the output wave modulated by the second frequency are minimized, approximately establishing the designed phase difference by causing each sinusoidal like wave to have a certain frequency, then controlling the relative phase of the sinusoidal like waves until amplitude variations at twice the certain frequency of an envelope of the output wave modulated by the certain frequency are minimized.

45. The method of claim 44 wherein the sinusoidal like waves are derived from a digital to analog converter arrangement responsive to signals derived from a memory including tables of amplitudes vs. phase position values and slope vs. phase position values, and further including inserting into the tables the amplitude and slope values to enable the sinusoidal like waves having the controlled offset and maximum amplitudes and phase to be derived.

46. The method of claim 44 wherein the first frequency is twice the second frequency and the certain frequency equals the second frequency, and further including: while the sinusoidal waves have the first and second frequencies, feeding the amplitude variations of the output wave envelope through a bandpass filter having a bandpass that passes the first frequency and rejects the second frequency.

47. The method of claim 43 wherein the analog processing circuitry is susceptible of introducing differential delays between sources of the different sinusoidal waves and the output wave, and further including: controlling the amount of relative delay imposed on the analog sinusoidal waves in accordance with the introduced differential delays.

48. The method of claim 47 wherein the DC offset of the sinusoidal waves is minimized by causing each sinusoidal wave to have a first frequency, and then adjusting a DC offset of each sinusoidal wave so amplitude variations at the first frequency of an envelope of the output wave modulated by the first frequency are minimized; approximately equalizing the maximum amplitudes by causing each sinusoidal wave to have a second frequency, then adjusting the relative maximum amplitudes of the sinusoidal waves until amplitude variations at twice the second frequency of an envelope of the output wave modulated by the second frequency are minimized; approximately establishing the designed phase difference by causing each sinusoidal wave to have a certain frequency, then controlling the relative phase of the sinusoidal waves until amplitude variations at twice the certain frequency of an envelope of the output wave modulated by the certain frequency are minimized; controlling the amount of relative delay by causing the sinusoidal waves to have a third frequency, and adjusting the relative delay of the processing circuitry so amplitude variations at the twice third frequency of an envelope of the output wave modulated by the third frequency are minimized.

49. The method of claim 48 further including comparing the amplitude of variations of the output wave envelope after all of said controls have been performed with the amplitude of variations of the output wave envelope before any of the controls were performed; and repeating the control steps for the DC offset, maximum amplitude, phase and delay in response to the envelope amplitude comparing step indicating there has been a reduction in the envelope variations.

50. The method of claim 24 wherein the differential variations include variations from a designed maximum value of the analog baseband sinusoidal waves, further including controlling the relative values of the sinusoidal wave maximum amplitudes so they are approximately equalized.

51. The method of claim 50 wherein the maximum amplitudes are approximately equalized, approximately establishing the designed phase difference by causing each sinusoidal wave to have a certain frequency, then controlling the relative phase of the sinusoidal waves until amplitude variations at twice the certain frequency of an envelope of the output wave modulated by the certain frequency are minimized.

52. The method of claim 24 wherein the differential variations include variations from a designed phase difference of the analog sinusoidal waves, further including controlling the relative instantaneous values of the sinusoidal wave amplitudes so they have approximately the designed phase difference.

53. The method of claim 52 wherein the sinusoidal wave instantaneous amplitude values are controlled so they have approximately the designed phase difference, approximately establishing the designed phase difference by causing each sinusoidal wave to have a certain frequency, then controlling the relative phase of the sinusoidal waves until amplitude variations at twice the certain frequency of an envelope of the output wave modulated by the certain frequency are minimized.

54. The method of claim 24 wherein the analog processing circuitry is susceptible of introducing differential delays between sources of the different sinusoidal waves and the output wave and controlling the amount of relative delay imposed on the analog sinusoidal waves in accordance with the introduced differential delays.

55. The method of claim 54 wherein the relative delay is changed by causing the sinusoidal waves to have a third frequency commensurate with a voltage near a maximum voltage of an analog signal associated with an input signal for the transmitter, and adjusting the relative delay of the processing circuitry so amplitude variations at the third frequency of an envelope of the output wave modulated by the third frequency are minimized.

56. The method of claim 24, wherein the transmitter transmits a substantially constant amplitude envelope and the angle modulated output wave has a substantially constant amplitude envelope.

57. A radio transmitter for a signal representing speech and/or music broadcast information to be angle modulated on a carrier having a frequency at a carrier frequency for the transmitter comprising plural substantially constant amplitude sinusoidal wave sources, each source having a variable angle determined by instantaneous amplitudes of the speech and/or music broadcast information and at least one controlled parameter including DC offset, peak to peak amplitude and phase angle, all of the sources having the same instantaneous frequency;

plural mixers, each mixer being associated with and connected to be responsive to a different one of the sinusoidal waves derived from the source and a different phase of the carrier frequency, the mixers deriving output signals that are linearly combined to form an angle modulated output wave having a carrier at the carrier frequency, the carrier frequency being angle modulated by the speech and/or music broadcast information, the output wave tending to include at least one component in addition to the angle shifted carrier frequency, the at least one component having an adverse effect on a receiver responsive to the transmitter;

the at least one controlled parameter having a value that reduces the at least one component of the output wave.

58. The transmitter of claim 57 wherein the at least one component is at the frequency of the carrier, and the at least one controlled parameter is DC offset, a DC path being provided between each of the sources and each of the mixers.

59. The transmitter of claim 57 wherein the at least one component is at the frequency of the carrier and at a frequency equal to the carrier plus twice the frequency of the sinusoidal waves, and the at least one controlled parameter is peak to peak amplitude.

60. The transmitter of claim 59 wherein the parameter also includes phase angle.

61. The transmitter of claim 60 further including a controlled delay arrangement so the relative delays between the sources and their associated mixers are controllable to reduce the amplitude of the components at the carrier frequency and at the carrier frequency with a deviation twice the frequency of the sinusoidal waves.

62. The transmitter of claim 57 wherein the angle modulation is frequency modulation, the at least one component including components at the frequency of the carrier and at a frequency equal to the carrier frequency plus or minus a frequency equal to twice the frequency of the sinusoidal waves, the at least one controlled parameter including all of said parameters, the values of all of said parameters being such that amplitude of the components in the output wave at (a) the carrier frequency and (b) at a frequency equal to the carrier frequency plus or minus a frequency equal to twice the frequency of the sinusoidal waves are much smaller than the amplitude at the carrier frequency plus or minus the frequency of the sinusoidal waves, whereby the carrier frequency component and the component at the frequency equal to the carrier frequency plus or minus twice the frequency of the sinusoidal waves do not have an adverse effect on a receiver responsive to the transmitter, a DC path being provided between each of the sources and each of the mixers.

63. The transmitter of claim 62 further including a controlled delay arrangement so the relative delays between the sources and their associated mixers are controllable to reduce the amplitude of the unwanted in-band image, which creates an envelope component at twice the frequency of the sinusoidal waves.

64. The radio transmitter of claim 57, wherein each source nominally has the same amplitude and the angle modulated output wave has a substantially constant amplitude envelope.

65. A radio transmitter for a signal representing speech and/or music broadcast information to be frequency modulated on a carrier having a frequency at a carrier frequency for the transmitter comprising digital processing circuitry adapted to be responsive to a source of a first digital signal having an amplitude determined by sequential samples of the amplitude of the speech and/or music broadcast information, the digital processing circuitry being arranged to derive plural digital output signals each having a sequence of values representing a sinusoidal wave having a nominal substantially constant maximum amplitude and a baseband frequency, the baseband frequency being determined approximately by the amplitudes of the sequential samples, each of the digital signals approximately representing a different designed phase of the sinusoidal wave, the digital processing circuitry including a digital to analog converter arrangement for the plural digital signals, the digital to analog converter arrangement being arranged to derive plural analog baseband sinusoidal signals, each of the analog baseband sinusoidal signals nominally having (a) a substantially constant maximum amplitude, and (b) a baseband frequency and phase respectively determined by the different derived digital output signals; and analog processing circuitry connected to be responsive to the analog baseband sinusoidal signals and the carrier, the analog processing circuitry being arranged to derive a frequency modulated output wave having a carrier at the carrier frequency, the carrier frequency being frequency shifted to a deviation frequency by the speech and/or music broadcast information.

66. The transmitter of claim 65 wherein the digital processing circuitry is arranged to control the values of the digital output signals so differential variations having a tendency to be imposed by the analog processing circuitry on the analog baseband sinusoidal signals and which tend to degrade the output wave are compensated.

67. The transmitter of claim 66 wherein the digital processing circuitry includes a memory adapted to be loaded with values representing many amplitudes at different phases of a baseband sinusoidal wave and many slopes at different phases of the sinusoidal wave, the digital processing circuitry being arranged to (a) read the amplitude and slope values from the memory as a function of amplitudes of the sequential samples, (b) combine the read amplitude and slope values to determine an instantaneous approximate amplitude of each of the sinusoidal waves, and (c) control the approximate amplitude of each of the sinusoidal waves to provide the compensation for the differential variations.

68. The transmitter of claim 67 wherein the differential variations include DC offset inserted by the analog processing circuitry on the analog baseband sinusoidal signals and tended to be reflected in the output wave, the digital processing circuitry being arranged to control values of the baseband sinusoidal wave amplitudes in accordance with the DC offset so the sinusoidal representing signal as derived in the digital processing circuitry can have DC offsets to compensate for the offsets tended to be reflected in the output wave.

69. The transmitter of claim 68 wherein the differential variations include variations from the designed phase difference of the analog baseband sinusoidal signals, the digital processing circuitry being arranged to control the values of the baseband sinusoidal wave amplitudes in accordance with the variations from the designed phase difference of the analog baseband sinusoidal signals.

70. The transmitter of claim 69 wherein the differential variations include variations of the relative peak amplitudes of the different analog baseband sinusoidal signals, the digital processing circuitry being arranged to control the relative values of the baseband sinusoidal wave peak amplitudes.

71. The transmitter of claim 67 wherein the differential variations include variations from the designed phase difference of the analog baseband sinusoidal signals, the digital processing circuitry being arranged to control the values of the baseband sinusoidal wave amplitudes in accordance with the variations from the designed phase difference of the analog baseband sinusoidal signals.

72. The transmitter of claim 67 wherein the differential variations include variations of the relative peak amplitude of the different analog baseband sinusoidal signals, the digital processing circuitry being arranged to control the relative values of the baseband sinusoidal wave peak amplitudes.

73. The transmitter of claim 66 wherein the digital processing circuitry includes a memory adapted to be loaded with values representing many amplitudes at different phases of a baseband sinusoidal wave, the digital processing circuitry being arranged to (a) read the amplitude values from the memory as a function of amplitudes of the sequential samples, and (b) control the approximate amplitude of each of the sinusoidal waves to provide the compensation for the differential variations.

74. The transmitter of claim 66 wherein the differential variations include DC offset of the analog baseband sinusoidal signals, the digital processing circuitry being arranged to control values of the baseband sinusoidal wave amplitudes in accordance with the DC offset.

75. The transmitter of claim 74 wherein the differential variations include variations of the relative maximum amplitudes of the analog baseband sinusoidal signals, the digital processing circuitry being arranged to control values of the baseband sinusoidal wave amplitudes in accordance with the variations of the relative maximum amplitudes of the analog baseband sinusoidal signals.

76. The transmitter of claim 75 wherein the differential variations include variations from a designed phase difference of the analog baseband sinusoidal signals, the digital processing circuitry being arranged to control the values of the baseband sinusoidal wave amplitudes in accordance with the variations from a designed phase difference of the analog baseband sinusoidal signals.

77. The transmitter of claim 66 wherein the differential variations include variations of the relative maximum amplitudes of the analog baseband sinusoidal signals, the digital processing circuitry being arranged to control the values of the baseband sinusoidal wave amplitudes in accordance with the variations of the relative maximum amplitudes of the analog baseband sinusoidal signals.

78. The transmitter of claim 66 further including a detector for variations in the amplitude of the envelope of the frequency modulated output wave, the digital processing circuitry being connected to be responsive to the detector and arranged to control the digital output signals to provide the compensation.

79. The transmitter of claim 66 wherein the differential variations include variations from a designed phase difference of the analog baseband sinusoidal signals, the digital processing circuitry being arranged to control the values of the baseband sinusoidal wave amplitudes in accordance with the variations from the designed phase difference of the analog baseband sinusoidal signals.

80. The transmitter of claim 65 wherein the plural analog baseband signals have a tendency to be time delayed by different amounts in the analog processing circuitry, and further including a delay arrangement for substantially overcoming the tendency of the plural analog baseband signals to be time delayed by different amounts.

81. The transmitter of claim 80 further including a detector for variations in the amplitude of the envelope of the frequency modulated output wave, the digital processing circuitry being connected to respond to the detector to control the amount of delay introduced by the delay arrangement.

82. The transmitter of claim 65 wherein the plural analog baseband signals have a tendency to be time delayed by different amounts in the analog processing circuitry, a delay circuit in the analog processing circuitry connected to be responsive to one of the analog sinusoidal signals for overcoming the tendency of the plural analog baseband signals to be time delayed by different amounts.

83. The transmitter of claim 82 further including a detector for variations in the amplitude of the envelope of the frequency modulated output wave, the digital processing circuitry responding to the detector to control the amount of delay introduced by the delay circuit.

84. The transmitter of claim 62 wherein the digital processing circuitry includes a memory adapted to be loaded with values representing many amplitudes at different phases of a baseband sinusoidal wave and many slopes at different phases of the sinusoidal wave, the digital processing circuitry being arranged to (a) read the amplitude and slope values from the memory as a function of amplitudes of the sequential samples, and (b) combine the read amplitude and slope values to determine an instantaneous approximate amplitude of each of the sinusoidal waves.

85. The radio transmitter of claim 65, wherein the analog baseband sinusoidal signals nominally have the same substantially constant maximum amplitude and the frequency modulated output wave has a substantially constant amplitude envelope.

86. A radio transmitter for a signal representing speech and/or music broadcast information to be angle modulated on a carrier having a frequency at a carrier frequency for the transmitter comprising digital processing circuitry adapted to be responsive to a first digital signal having an amplitude determined by sequential samples of the amplitude of the speech and/or music broadcast information, the digital processing circuitry being arranged to derive plural digital output signals each having a sequence of values representing a sinusoidal wave nominally having a substantially constant maximum amplitude and a frequency, the frequency being determined approximately by the sequential samples, each of the digital signals approximately representing a different phase of the sinusoidal wave, the digital processing circuitry including a digital to analog converter arrangement for the plural digital signals, the digital to analog converter arrangement being arranged to derive plural analog baseband sinusoidal signals, each of the analog baseband sinusoidal signals having (a) a substantially constant maximum amplitude, and (b) a frequency and phase respectively determined by the different derived digital output signals;

analog processing circuitry connected to be responsive to the analog baseband sinusoidal signals and the carrier, the analog processing circuitry being arranged to derive an angle modulated output wave having a carrier at the carrier frequency, the carrier being angle modulated by the speech and/or music broadcast information;

the digital processing circuitry being arranged to control the values of the digital output signals so differential variations having a tendency to be imposed by the analog processing circuitry on the analog sinusoidal signals and which tend to degrade the output wave are compensated.

87. The transmitter of claim 86 wherein the digital processing circuitry includes a memory loaded with values representing many amplitudes at different phases of a baseband sinusoidal wave and many slopes at different phases of the sinusoidal wave, the digital processing circuitry being arranged to (a) read the amplitude and slope values from the memory as a function of amplitudes of the sequential samples, (b) combine the read amplitude and slope values to determine an instantaneous approximate amplitude of each of the sinusoidal waves, and (c) control the approximate amplitude of each of the sinusoidal waves to provide the compensation for the differential variations.

88. The transmitter of claim 86 wherein the digital processing circuitry includes a memory loaded with values representing many amplitudes at different phases on a sinusoidal wave, the digital processing circuitry being arranged to (a) read the amplitude values from the memory as a function of amplitudes of the sequential samples, and (b) control the approximate amplitude of each of the sinusoidal waves to provide the compensation for the differential variations.

89. The radio transmitter of claim 86, wherein the broadcast information is to be angle modulated as a substantially constant amplitude envelope and the sinusoidal waves nominally have the same amplitudes and the angle modulated output wave has a substantially constant amplitude envelope.

90. A radio transmitter for a signal representing broadcast information to be angle modulated by a carrier having a frequency at a carrier frequency for the transmitter comprising digital processing circuitry adapted to be responsive to a first digital signal having an amplitude determined by sequential samples of the amplitude of the speech and/or music broadcast information, the digital processing circuitry being arranged to derive plural digital output signals each having a sequence of values representing a sinusoidal wave having a substantially constant maximum amplitude and a frequency, the frequency being determined approximately by the sequential samples, each of the digital signals approximately representing a different phase of the sinusoidal wave, the digital processing circuitry including a memory loaded with values representing many amplitudes at the different phases of a sinusoidal wave and many slopes at different phases of the sinusoidal wave, the digital processing circuitry being arranged to (a) read the amplitude and slope values from the memory as a function of amplitudes of the sequential samples, and (b) combine the read amplitude and slope values to determine an instantaneous approximate amplitude of each of the sinusoidal waves, a digital to analog converter arrangement for the plural digital signals, the digital to analog converter arrangement being arranged to derive plural analog sinusoidal signals, each of the analog sinusoidal signals having (a) a substantially constant maximum amplitude, and (b) a frequency and phase respectively determined by the different derived digital output signals; and analog processing circuitry connected to be responsive to the analog sinusoidal signals and the carrier, the analog processing circuitry being arranged to derive an angle modulated output wave having a carrier at the carrier frequency, the carrier being angle modulated by the speech and/or music broadcast information.

91. A method of operating a radio transmitter responsive to a signal representing speech and/or music broadcast information and a carrier having a frequency at a carrier frequency for the transmitter comprising digitally processing a first digital signal having an amplitude determined by sequential samples of the amplitude of the speech and/or music broadcast information, the digital processing deriving plural digital output signals each having a sequence of values representing a sinusoidal wave nominally having a substantially constant maximum amplitude and a baseband frequency, the baseband frequency being determined approximately by the amplitudes of the sequential samples, each of the digital signals approximately representing a different phase of the sinusoidal wave, converting the plural digital signals into plural analog baseband sinusoidal signals, each of the analog baseband sinusoidal signals having (a) a substantially constant maximum amplitude, (b) a baseband frequency respectively determined by the different derived digital output signals and (c) a phase determined by one of the derived digital outputs; and deriving an angle modulated output wave having a carrier at the carrier frequency by responding to the analog baseband sinusoidal signals and the carrier, the carrier frequency being angle modulated by the speech and/or music broadcast information.

92. The method of claim 91 wherein the digital processing controls the values of the digital output signals so there is compensation for differential variations having a tendency to be imposed on the analog baseband sinusoidal signals and which tend to degrade the output wave by analog processing circuitry which derives the output wave.

93. The method of claim 92 wherein the digital processing is performed with circuitry including a memory, the method further including loading the memory with values representing many amplitudes at different phases of a baseband sinusoidal wave and many slopes at different phases of the sinusoidal wave, the digital processing circuitry (a) reading the amplitude and slope values from the memory as a function of amplitudes of the sequential samples, (b) combining the read amplitude and slope values and thereby determining an instantaneous approximate amplitude of each of the sinusoidal waves, and (c) controlling the approximate amplitude of each of the sinusoidal waves to provide the compensation for the differential variations.

94. The method of claim 93 wherein the differential variations include DC offset of the analog baseband sinusoidal signals, the digital processing circuitry controlling values of the baseband sinusoidal wave amplitudes to substantially eliminate the DC offset.

95. The method of claim 94 wherein the differential variations include variations from a designed phase difference of the analog baseband sinusoidal signals, the digital processing circuitry controlling the instantaneous values of the baseband sinusoidal wave amplitudes to substantially eliminate the variations from the designed phase difference.

96. The method of claim 95 wherein the differential variations include variations from a designed maximum peak to peak value of the analog baseband sinusoidal signals, the digital processing circuitry controlling the values of the baseband sinusoidal wave maximum peak to peak amplitudes to substantially eliminate the variations from the designed maximum peak to peak value.

97. The method of claim 93 wherein the differential variations include variations from a designed phase difference of the analog baseband sinusoidal signals, the digital processing circuitry controlling the instantaneous values of the baseband sinusoidal wave amplitudes to substantially eliminate the variations from the designed phase difference.

98. The method of claim 93 wherein the differential variations include variations from a designed maximum peak to peak value of the analog baseband sinusoidal signals, the digital processing circuitry controlling the values of the baseband sinusoidal wave maximum peak to peak amplitudes to substantially eliminate the variations from the designed maximum peak to peak value.

99. The method of claim 92 wherein the digital processing circuitry includes a memory, further including loading the memory with values representing amplitudes at many different phases of a baseband sinusoidal wave, the digital processing circuitry (a) reading the amplitude values from the memory as a function of amplitudes of the sequential samples, and (b) controlling the approximate amplitude of each of the sinusoidal waves to provide the compensation for the differential variations.

100. The method of claim 91 wherein the plural analog baseband signals have a tendency to be time delayed by different amounts in analog processing circuitry which responds to the analog baseband signals, and further including delaying at least one of the plural analog baseband signals to overcome the tendency of the plural analog baseband signals to be time delayed by different amounts.

101. The method of claim 100 further including detecting variations in the amplitude of the envelope of the frequency modulated output wave, the digital processing circuitry responding to the detected variations to control the amount of introduced delay.

102. The method of claim 91, wherein the amplitudes of the plural waves are nominally the same and the output wave has a substantially constant amplitude envelope.

103. Apparatus for driving an output device with a single sideband modulated output having a frequency at a carrier frequency plus or minus a modulation frequency determined by an input comprising plural channels each responsive to a sinusoidal like wave having variations determined by the amplitude of the input, each wave having a designed nominal phase difference, a plurality of mixers, each mixer being connected to be responsive to a different one of the sinusoidal like waves and to a different phase at the carrier frequency, each of the mixers deriving a separate mixed output signal, the mixed output signals being linearly coupled together to derive the single sideband modulated output, the channels, mixers, and circuitry associated with them having a tendency to introduce unwanted components in the single sideband output, and processing circuitry responsive to a replica of the output while the output is being supplied to the output device, the processing circuitry being arranged to adjust at least one of the channels in response to the replica, the amplitude and the phase of the sinusoidal like waves being such that at least one of the unwanted components is substantially not present in the output wave.

104. The apparatus of claim 103 wherein the processing circuitry responds to a component of the output at a frequency removed from the carrier frequency by the frequency of the modulation to make the adjustment.

105. The apparatus of claim 104 wherein the single sideband modulated output is angle modulated and coupled to the output device via an amplitude limiter, the processing circuitry being responsive to an angle modulated output replica with envelope variations on the single sideband angle modulated output as applied to the limiter, the processing circuitry making the adjustment in response to variations at the frequency of the carrier in the amplitude of the envelope of the angle modulated output replica as applied to the limiter.

106. The apparatus of claim 105 wherein the processing circuitry responds to the variations in the amplitude of the envelope of the angle modulated output replica as applied to the limiter to iteratively modify the relative amplitudes and phases of the sinusoidal like waves.

107. The apparatus of claim 103 wherein the processing circuitry responds to a component of the output at a frequency removed from the carrier frequency by twice the frequency of the modulation to make the adjustment.

108. The apparatus of claim 103 wherein the single sideband modulated output is angle modulated and coupled to the output device via an amplitude limiter, the processing circuitry being responsive to an angle modulated output replica with envelope variations on the single sideband angle modulated output as applied to the limiter, the processing circuitry making the adjustment in response to variations in the amplitude of the envelope of the angle modulated output replica as applied to the limiter.

109. The apparatus of claim 108 wherein the processing circuitry responds to the variations in the amplitude of the envelope of the angle modulated output replica as applied to the limiter to iteratively modify the relative amplitudes and phases of the sinusoidal like waves.

110. The apparatus of claim 109 wherein the processing circuitry responds to the variations in the amplitude of the envelope of the angle modulated output replica as applied to the limiter to iteratively modify the relative delays of the sinusoidal like waves.

111. The apparatus of claim 108 wherein the processing circuitry responds to the variations in the amplitude of the envelope of the angle modulated output replica as applied to the limiter to iteratively modify the relative delays of the sinusoidal like waves.

112. The apparatus of claim 103 wherein the single sideband modulated output is angle modulated and coupled to the output device via an amplitude limiter, the processing circuitry being responsive to an angle modulated output replica with envelope variations on the single sideband angle modulated output as applied to the limiter, the processing circuitry making the adjustment in response to variations at different frequency bands in the amplitude of the envelope of the angle modulated output replica as applied to the limiter.

113. The apparatus of claim 112 wherein the processing circuitry responds to low frequency variations in the amplitude of the envelope of the angle modulated output replica as applied to the limiter to iteratively modify the relative amplitudes and phases of the sinusoidal like waves.

114. The apparatus of claim 113 wherein the processing circuitry responds to high frequency variations in the amplitude of the envelope of the angle modulated output replica as applied to the limiter to iteratively modify the relative delays of the sinusoidal like waves.

115. The apparatus of claim 112 wherein the processing circuitry responds to high frequency variations in the amplitude of the envelope of the angle modulated output replica as applied to the limiter to iteratively modify the relative delays of the sinusoidal like waves.

116. The apparatus of claim 103, wherein the amplitude envelope and each sinusoidal wave has nominally the same constant, maximum amplitude.

* * * * *